(12) United States Patent
Anderson et al.

(10) Patent No.: US 12,320,882 B2
(45) Date of Patent: Jun. 3, 2025

(54) INTEGRATED VECTOR NETWORK ANALYZER

(71) Applicant: Keysight Technologies, Inc., Santa Rosa, CA (US)

(72) Inventors: Keith F. Anderson, Santa Rosa, CA (US); Alex Grichener, Plymouth, MN (US)

(73) Assignee: KEYSIGHT TECHNOLOGIES, INC, Santa Rosa, CA (US)

( * ) Notice: Subject to any disclaimer, the term of this patent is extended or adjusted under 35 U.S.C. 154(b) by 0 days.

(21) Appl. No.: 18/432,131

(22) Filed: Feb. 5, 2024

(65) Prior Publication Data

US 2024/0175959 A1 May 30, 2024

Related U.S. Application Data

(60) Division of application No. 17/733,515, filed on Apr. 29, 2022, now Pat. No. 11,927,661, which is a
(Continued)

(51) Int. Cl.
- *G01R 35/00* (2006.01)
- *G01R 27/28* (2006.01)
- *H04B 17/21* (2015.01)

(52) U.S. Cl.
CPC .............. *G01R 35/00* (2013.01); *G01R 27/28* (2013.01); *H04B 17/21* (2015.01)

(58) Field of Classification Search
CPC ......... G01R 35/00; G01R 27/28; H04B 17/21
(Continued)

(56) References Cited

U.S. PATENT DOCUMENTS

| | | | | |
|---|---|---|---|---|
| 6,249,128 B1 * | 6/2001 | Begg | .................... | G01R 35/005 |
| | | | | 324/646 |
| 6,300,775 B1 * | 10/2001 | Peach | .................... | G01R 35/00 |
| | | | | 702/90 |

(Continued)

FOREIGN PATENT DOCUMENTS

| | | |
|---|---|---|
| CN | 110967573 A | 4/2020 |
| JP | 4124841 B2 * | 7/2008 |

OTHER PUBLICATIONS

Nakayama; Translation of JP4124841B2; Pub. Date Jul. 23, 2008; Translation by Clarivate Analytics (Year: 2008).*

(Continued)

*Primary Examiner* — Paresh Patel
*Assistant Examiner* — Rahul Maini

(57) ABSTRACT

A method is provided for determining source match of a test system including an RF source, a vector network analyzer (VNA) and a test port. The method includes connecting a first calibration standard to the test port; generating an RF signal using the RF source, and applying the RF signal to the first calibration standard; measuring a first incident signal of the RF signal at a first receiver of the test system, and measuring a first reflected signal at a second receiver of the test system; connecting a second calibration standard to the test port; measuring a second incident signal of the RF signal at the first receiver of the test system, and measuring a second reflected signal at the second receiver of the test system; and determining the source match of the test system using the first incident and reflected signals and the second incident and reflected signals.

20 Claims, 12 Drawing Sheets

Related U.S. Application Data division of application No. 16/544,416, filed on Aug. 19, 2019, now Pat. No. 11,353,536, which is a continuation-in-part of application No. 16/147,657, filed on Sep. 29, 2018, now Pat. No. 10,969,421.

(58) Field of Classification Search
USPC .................................................... 324/750.02
See application file for complete search history.

(56) References Cited

U.S. PATENT DOCUMENTS

| | | | |
|---|---|---|---|
| 7,777,497 | B2 | 8/2010 | Albert-Lebrun et al. |
| 8,675,719 | B2 | 3/2014 | Dobyns et al. |
| 9,838,986 | B2 | 12/2017 | Williams et al. |
| 9,869,699 | B2 | 1/2018 | Dalebroux |
| 10,488,463 | B2 | 11/2019 | Pandya et al. |
| 10,969,421 | B2 | 4/2021 | Anderson et al. |
| 2004/0054490 | A1 | 3/2004 | Bradley et al. |
| 2005/0258815 | A1 | 11/2005 | Shoulders |
| 2005/0289392 | A1* | 12/2005 | Haruta ................. G01R 35/005 714/14 |
| 2009/0125264 | A1 | 5/2009 | Betts et al. |
| 2009/0184721 | A1 | 7/2009 | Albert-Lebrun et al. |
| 2009/0216468 | A1* | 8/2009 | Anderson ............ G01R 23/165 702/57 |
| 2010/0176789 | A1 | 7/2010 | Zoughi et al. |
| 2011/0238383 | A1 | 9/2011 | Metzger |
| 2014/0368216 | A1* | 12/2014 | Pailloncy ............. G01R 35/005 324/602 |
| 2017/0234959 | A1 | 8/2017 | Lee et al. |
| 2018/0188306 | A1 | 7/2018 | Pal et al. |

OTHER PUBLICATIONS

Office Action dated Jun. 18, 2020, for U.S. Appl. No. 16/147,657, 33 pgs.

Pooyan Sakian et al.; "Noise Figure and S-Parameter Measurement Setups for On-Wafer Differential 60GHz Circuits"; Pub. Date 2010; 2010 76th ARFTG Microwave Measurement Conference; pp. 1-4.

Notice of Allowance dated Dec. 16, 2020 for U.S. Appl. No. 16/147,657, 10 pgs.

Chinese Office Action dated Jul. 6, 2021, application No. 20190926839.0, 17 pgs.

English translation of Chinese Office Action dated Jul. 6, 2021, 15 pgs.

* cited by examiner

INTEGRATED VECTOR NETWORK ANALYZER

CROSS REFERENCE TO RELATED APPLICATIONS

This application is a divisional under 37 C.F.R. § 1.53(b) of commonly owned U.S. patent application Ser. No. 17/733,515 to Anderson et al., entitled "Integrated Vector Network Analyzer," filed on Apr. 29, 2022 (published as U.S. Patent Application Pub. No. 2022/0260662 on Aug. 18, 2022), which is a divisional under 37 C.F.R. § 1.53(b) of commonly owned U.S. patent application Ser. No. 16/544,416 to Anderson et al., entitled "Integrated Vector Network Analyzer," filed on Aug. 19, 2019 (issued as U.S. Pat. No. 11,353,536 on Jun. 7, 2022), which is a continuation in part under 37 C.F.R. § 1.53(b) of commonly owned U.S. patent application Ser. No. 16/147,657 to Anderson et al., entitled "Integrated Vector Network Analyzer," filed on Sep. 29, 2018 (issued as U.S. Pat. No. 10,969,421 on Apr. 6, 2021). The present application claims priority under 35 U.S.C. § 120 to U.S. patent application Ser. No. 17/733,515, U.S. patent application Ser. No. 16/544,416 and U.S. patent application Ser. No. 16/147,657, the disclosures of which are hereby incorporated by reference in their entireties.

BACKGROUND

A vector network analyzer (VNA) is a type of radio frequency (RF) test equipment used to characterize network devices, for example, in terms of scattering parameters (S-parameters), for purposes of design, testing and/or calibration. The network devices characterized by a VNA may include a device under test (DUT), as well as an interconnect between the DUT and the VNA used to test the DUT. The interconnect may be implemented as a cable, a probe, a fixture, a filter, or other electrical component capable of passing a signal between the DUT and the VNA. A cable, or other connectorized component, has connectors on both ends for connecting to the DUT and to the VNA. A probe has a connector on one end and a probe tip(s) on the other end. The connector may be connected to the VNA and the probe tip(s) may be used to temporarily contact a circuit in the DUT, although the opposite arrangement may be used. A fixture has a connector on one end and an interface on the other end, where the interface may be non-standard and thus difficult to calibrate. A fixture is similar to a probe but the connection point is not moved around a circuit. A VNA is able to provide both amplitude and phase measurements of the network devices.

A VNA may be used in combination with other RF test instruments, such as signal sources (signal generators), spectrum analyzers and oscilloscopes. For example, when a DUT is measured using another RF test instrument, measurement errors are introduced due to the interconnect and equipment drift, for example. A simple VNA may be combined with the RF test instrument in order to provide error correction and advanced measurement capabilities. The VNA measurements may be used, for example, to equalize interconnects, correct source flatness, measure mismatch, measure gain, align phase between sources, and correct external test system preamplifiers.

For example, when an RF test instrument is connected to a DUT through a cable (or other interconnect), the errors introduced by the cable need to be eliminated. Conventionally, this may be accomplished by disconnecting the cable from the RF test instrument and connecting it to a VNA, performing measurements on the cable using the VNA to determine the errors, disconnecting the cable from the VNA and reconnecting to the RF test instrument, and manually loading the errors determined by the VNA into the RF test instrument so that subsequent measurements performed on the DUT by the RF test instrument can be corrected. Thus, for accurate measurements, the VNA is used to remove the effects of the cable. e.g., by measuring the cable and then de-embedding the relevant cable measurements from the measured data obtained by the RF test instrument. This procedure is time consuming and inefficient, particularly for unsophisticated users.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

Figure 1:
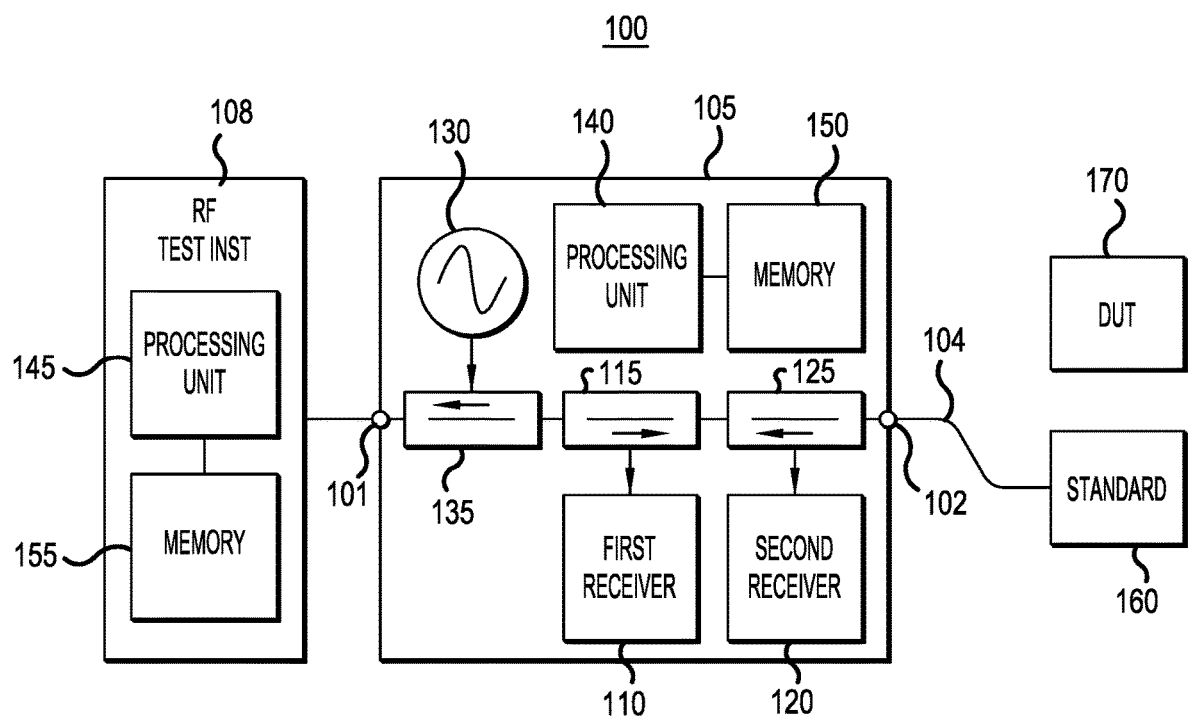
FIG. 1 is a simplified block diagram of a test system including a universal vector network analyzer (VNA) module, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments generally provide a system and method including integrated VNA functionality to overcome the drawbacks of using a conventional VNA for performing RF testing on a DUT. In an embodiment, the integrated VNA functionality is provided by a universal VNA module that measures S-parameters of a cable and/or other test fixtures and automatically loads the measured S-parameters into the RF test instrument for performing the test, while remaining connected to the RF test instrument throughout the test procedure. An advantage is not having to physically connect and disconnect the VNA module at the RF port. Or, the VNA circuitry may be disconnected from the RF test instrument once the S-parameters are obtained. The VNA module is universal in that it is compatible with various types of RF test instruments, without the need for modification.

In other embodiments, the integrated VNA functionality is provided by VNA circuitry embedded in the RF test instrument (e.g., RF signal generator, spectrum analyzer, oscilloscope), where again the VNA circuitry measures S-parameters of the cable and/or other test fixtures and automatically loads the measured S-parameter data into the RF test instrument for performing the test. An advantage is not having to physically connect and disconnect the VNA circuitry at an RF port between calibration and testing. VNA circuitry is embedded in that it is permanently interconnected with the RF test instrument circuitry, housed in the same chassis, and accessible through the same front panel. In all embodiments, the RF test instrument and VNA module/VNA circuitry are thus able to determine errors in the system, make adjustments to measurements and/or signals to compensate for (offset) these errors during DUT testing.

FIG. 1 is a simplified block diagram of a test system including a universal VNA module, according to a representative embodiment.

Referring to FIG. 1, test system 100 includes a test instrument 108, a cable 104 and a universal VNA module 105 connected between the test instrument 108 and the cable 104. The cable 104 may be a coaxial cable, for example. Notably, the cable 104 is described herein for the sake of convenience, but it is understood that any other type of interconnect (e.g., a probe or a fixture) may be included in place of the cable 104, without departing from the scope of the present teachings. The test instrument 108 may be implemented by various types of RF test instruments, such as an RF signal generator, a spectrum analyzer or an oscilloscope, for example, although other types of RF test instrument may be incorporated without departing from the scope of the present teachings.

The cable 104 is connectable to a calibration device 160, which is used for calibrating the test system 100 during a calibrating stage, e.g., for S-parameter calibration, and to a device under test (DUT) 170, which is to be tested by the test system 100 during a testing stage following the calibrating stage. The cable 104 may be manually connected to and disconnected from each of the calibration device 160 and the DUT 170 for calibration and testing, respectively, e.g., while remaining connected to the VNA module 105. For purposes of explanation, the cable 104 is shown connected to the calibration device 160 for calibrating the test system 100, as discussed below. The calibration device 160 may be a mechanical calibration standard, such as an open/short/load kit, for example. Alternatively, the calibration device 160 may be an electrical calibration standard, such as an ECal module, available from Keysight Technologies, Inc., which may be a solid-state and/or mechanical calibration solution that contains electronic standards that are automatically switched into position during a measurement calibration, serving substantially the same purpose as the mechanical calibration. The ECal module may be an internal calibration unit that is used to help calibrate the S-parameters, e.g., to correct for receiver drift and to simplify external calibration requirements. Also, the VNA module 105 may include specific power calibration circuitry to further simplify and shorten the calibrating stage. The power calibration circuitry may include a known good power source used to calibrate the receivers.

The VNA module 105 includes an RF port (first port) 101 for connecting to the test instrument 108 and a test port (second port) 102 for connecting to the calibration device 160 in the calibrating stage or to the DUT 170 in the testing stage via the cable 104. The VNA module 105 further includes a first receiver 110, a second receiver 120 and an internal RF source 130, as well as a first coupling device 115, a second coupling device 125 and a third coupling device 135. The first and second coupling devices 115 and 125 may be individual couplers, for example, or may be implemented together as a dual directional coupler. Also, each of the first and second coupling devices 115 and 125 may be one of various types of coupling devices, such as a coupler, a coupled line structure, a combiner, a diplexer, a splitter, a balun, a bridge, or a resistive divider, for example. Also, the third coupling device 135 may be a coupler, a coupled line structure, a combiner, a switch, a diplexer, a splitter, a balun, a bridge, or a resistive divider, for example.

The first receiver 110 is configured to receive and measure a (coupled) portion of an incident RF signal through the first coupling device 115, and the second receiver 120 is configured to receive and measure a (coupled) portion of a reflected RF signal through the second coupling device 125. That is, the first and second receivers 110 and 120 measure forward and reverse waves of the incident and reflected RF signals, respectively. In the depicted embodiment, the incident RF signal is provided by the internal RF source 130 via the third coupling device 135 and is output through the test port 102, and the reflected RF signal is reflected through the cable 104 to the test port 102 in response to a reflection of the incident RF signal by the cable 104 and one of the calibration device 160 or the DUT 170.

In various embodiments, the VNA module 105 may also include transfer switch(es) (not shown in FIG. 1) associated with one or both of the first receiver 110 and the second receiver 120, respectively, to provide external access to one or both of the first receiver 110 and the second receiver 120, e.g., at a front panel. The transfer switch(es) enable more complex measurements by the VNA module 105, such as measuring gain of the DUT 170 and correcting for external preamplifiers, couplers, and the like, connected between the test port 102 and the DUT 170. Such transfer switch(es) may likewise be included in embedded VNA circuits and/or test instruments, such as embedded VNA circuits 205, 305 and 405 discussed below.

The internal RF source 130 may be selectively activated. That is, the internal RF source 130 is activated to provide the incident RF signal during calibration (e.g., testing effects of the cable 104 or other test fixture). The internal RF source 130 may not be activated during actual testing of the DUT 170 via the cable 104, which is performed by the test instrument 108. For example, in the event a single RF source is needed during testing of the DUT 170, it is typically provided by an RF source in the test instrument 108, although the internal RF source 130 may be used during testing of the DUT 170, without departing from the scope of the present teachings.

The first and second receivers 110 and 120 may be implemented by various types of RF receivers, without departing from the present teachings. For example, the first and second receivers 110 and 120 may be superheterodyne receivers, in which case the first receiver 110 may include a first mixer and a first analog digital converter (ADC) (not shown) and the second receiver 120 may include a second mixer and a second ADC (not shown). The first and second receivers 110 and 120 may share a common local oscillator (LO) source (not shown) that generates an LO signal provided to the first and second mixers for down-converting the received portion of the incident RF signal and the received portion of the received reflected RF signal, respectively. Alternatively, the first and second receivers 110 and 120 may include separate LO sources. In other configurations, the first and second receivers 110 and 120 may include first and second samplers (not shown) in place of the first and second mixers, respectively. In still other configurations, the first and second receivers 110 and 120 may be direct conversion, high frequency RF receivers that do not include mixers or samplers.

The VNA module 105 incudes a VNA processing unit (or controller) 140 and VNA memory 150. The VNA memory 150 may store a computer program and/or computer software executable by the VNA processing unit 140 of the VNA module 105. Also, the test instrument 108 includes a processing unit 145 and memory 155, e.g., not included in the VNA module 105. The memory 155 may store a computer program and/or computer software executable by the processing unit 145. In an embodiment, the processing unit 145 and the memory 155 may be included in a personal computer (PC) or work station (collectively referred to as external PC) separate from the test instrument 108, without departing from the scope of the present teachings. For example, in executing the computer program and/or software, the processing unit 145 may cause performance of the various steps in the method described below with reference to FIG. 5, as well as the various steps in the respective methods described below with reference to FIGS. 8A, 8B and 9.

The VNA processing unit 140 may control operations specific to the VNA module 105, such as controlling operation of the internal RF source 130, including turning the internal RF source 130 on/off and setting frequencies and modulation of the internal RF source 130 (e.g., for frequency sweeping or stepping). The VNA processing unit 140 may also control a communication interface via a calibration port (not shown), such as a Universal Serial Bus (USB) interface, for example, between the VNA module 105 and the test instrument 108 enabling exchange of data, including raw measurement data from the first and second receivers 110 and 120 and/or VNA module 105 calibration data, from factory calibration. In an embodiment, the VNA processing unit 140 may be the same as the processing unit 145, and the VNA memory 150 may be the same as the memory 155.

Generally, each of the VNA processing unit 140 and the processing unit 145 may be implemented by one or more computer processors, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory), such as VNA memory 150 and memory 155, for storing executable software/firmware executable code that allows it to perform the various functions. In an embodiment, the computer processor may comprise a central processing unit (CPU), for example, executing an operating system. A user input/output interface (not shown) may be included with the VNA processing unit 140 and/or the processing unit 145 for a user to control operations.

Each of the VNA memory 150 and the memory 155 may include a storage device, including a computer readable medium. A computer readable medium encompasses any non-transitory storage medium that may store instructions executable by a processor of a computing device. Examples of computer readable mediums include, but are not limited to, random access memory (RAM), read-only memory (ROM), flash memory, electrically programmable ROM (EPROM), electrically erasable programmable ROM (EEPROM), hard disk drive (HDD), USB drive, optical disk, or the like. Data from various characterizations and calibration results and characterizations of the cable 104 and/or the DUT 170 may be stored in the memory 155 and/or displayed on a display (not shown). The characterizations may include, for example, S-parameters of the cable 104 and S-parameter correction terms relative to the end of the cable 104. All or a portion of the characterizations and calibration results regarding the cable 104 may be stored in the VNA memory 150, as well, although not necessarily. Also, the VNA memory 150 may store factory calibration data in a factory calibration file for the VNA module 105, determined during factory calibration. The factory calibration file may include, for example, loss through the VNA module 105, and S-parameter correction terms and power correction terms at the test port 102. Setting of the VNA module 105 may drift over time (e.g., weeks or months), so the user may need to perform a VNA module calibration at the test port 102 periodically by connecting the calibration device 160 directly to the test port 102 and performing an S-parameter calibration, as would be apparent to one skilled in the art.

In order to perform proper testing of the DUT 170 by the test instrument 108, the test system 100 is first calibrated in the calibrating stage. Generally, the VNA module 105 performs measurements, which may be controlled by a program and/or computer executable instructions running on the processing unit 145 in the test instrument 108 or the external PC, for example. Thus, in various embodiments, the processing unit 145 controls the calibration process in the calibrating stage, including collecting measurement data, calculating correction values, and storing results in the memory 155 of the test instrument 108 and/or the external PC.

The cable 104 (or other interconnect) must be characterized so that effects of error introduced by the cable 104 during testing of the DUT 170 may be removed, e.g., by the test instrument 108, to ensure accuracy. That is, the processing unit 145 may characterize the cable 104 using measurements, e.g., S-parameter measurements, from the first and second receivers 110 and 120, and determine the S-parameters of the cable 104. The S-parameters are applied to correct errors introduced by the cable 104, as discussed below. The processing unit 145 may store the characterization information, including the S-parameters of the cable and the S-parameter correction terms relative to the end of the cable, in the memory 155. Then, the processing unit 145 may apply the S-parameters of the cable during testing of the DUT 170 to compensate for the error introduced by the cable 104. Generally, the S-parameter correction terms relative to the end of the cable 104 are determined by performing calibration with the calibration device 160, and the S-parameters of the cable 104 are determined by combining (e.g., determining the difference between) the S-parameter correction terms from the user calibration and the S-parameter correction terms from the factory calibration, discussed above.

More particularly, the calibration process includes connecting one end of the cable 104 (or other interconnect) to the test port 102, and the other end of the cable 104 to the calibration device 160 in order to perform S-parameter calibration. If the cable 104 is already connected to the DUT 170, it may be disconnected from the DUT 170 and reconnected to the calibration device 160 while remaining connected to the test port 102 of the VNA module 105. For purposes of explanation, it may be assumed that the calibration device 160 is a manual calibration standard having open, short and load standards. Each of the standards is connected to the cable 104, in turn, and the first and second receivers 110 and 120 measure the connected standard. For example, the VNA processing unit 140 may step the frequency of an RF signal provided by the internal RF source 130 over a wide range of frequencies, and the first and second receivers 110 and 120 may measure the incident and reflected RF signals respectively in response to the stepped frequencies. Alternatively or additionally, the processing unit 145 may step the frequency of the RF signal provided by the internal RF source 130 over the wide range of frequencies.

The measurements of the incident and reflected RF signals are corrected by a processing unit, such as the processing unit 145 (or the VNA processing unit 140). That is, the incident and reflected RF signals are measured by the ADCs of the first and second receivers 110 and 120, respectively, and converted to magnitude/phase pairs that describe the RF signals measured. The user calibration performed by the user using the calibration device 160 (e.g., external standards) results in the creation of S-parameter correction terms which are used to correct S-parameter measurements at the end of the cable 104. By using the S-parameter correction terms from the factory calibration and the user calibration, the S-parameters of the cable 104 can be calculated. The S-parameter correction terms from the user calibration may also be used to correct measurements of $S_{11}$ of the DUT 170, for example, during the testing stage.

After the standards (e.g., open, short, load) are measured, the processing unit 145 will use the S-parameters to provide and/or update a user calibration file. In an embodiment, a factory calibration file storing information from the factory calibration may be stored in the VNA memory 150 instead of or in addition to the memory 155. The user calibration file includes S-parameter correction terms referenced to the end of the cable 104 and the S-parameters of the cable 104. The factory calibration file includes S-parameter correction terms referenced to the test port 102, an absolute power calibration of the first and second receivers 110 and 120, and the S-parameters of the VNA through-path of the VNA module 105 (the S-parameters of the VNA through-path are not included in the factory calibration file of an embedded VNA circuit, e.g., discussed below with reference to FIGS. 2-4). The user calibration file and the factory calibration file may be automatically stored in the memory 155 in the test instrument 108 to be used during subsequent testing of the DUT 170 in the testing stage. In an embodiment, the factory calibration file may be stored in the VNA memory 150 instead of or in addition to the memory 155. Accordingly, errors caused by the cable 104 are calculated by the processing unit 145 and stored in the memory 155 for correcting performance during the testing of the DUT 170. Also, the calibration of the VNA module 105 at the end of the cable 104 is performed by the processing unit 145 and stored in the memory 155. The VNA module 105 is able to measure match of the DUT 170, if the test instrument 108 requires this information.

To perform actual testing of the DUT 170, the cable 104 is reconnected to the DUT 170, and the test instrument 108 initiates testing. The processing unit 145 of test instrument 108 will access information in the user calibration file, e.g., stored in the memory 155, to automatically correct for the error otherwise introduced by the cable 104 using S-parameters of the cable 104. For example, when the test instrument 108 is an RF signal generator, amplitude and phase of the RF signal(s) generated by an RF source in the RF signal generator will be changed to correct for this error. When the test instrument 108 is an oscilloscope or a spectrum analyzer, the measured signals received from the DUT 170 will be modified to correct for this error. The VNA module 105 may remain connected between the test instrument 108 and the cable 104 during the testing stage, simplifying the actions required by the user for disconnect and reconnecting components. However, the VNA module 105 may be disconnected, if desired, for example when the DUT 170 is tested using a high power device as a source.

As mentioned above, in alternative embodiments, VNA functionality may be embedded in the test instrument itself, as opposed to being provided by a separate VNA module, as discussed above. That is, a VNA circuit may be embedded in test instrument circuits within the test instrument, where the VNA circuit includes only those electrical components needed for VNA functionality, not already present in the test instrument.

Figure 2:
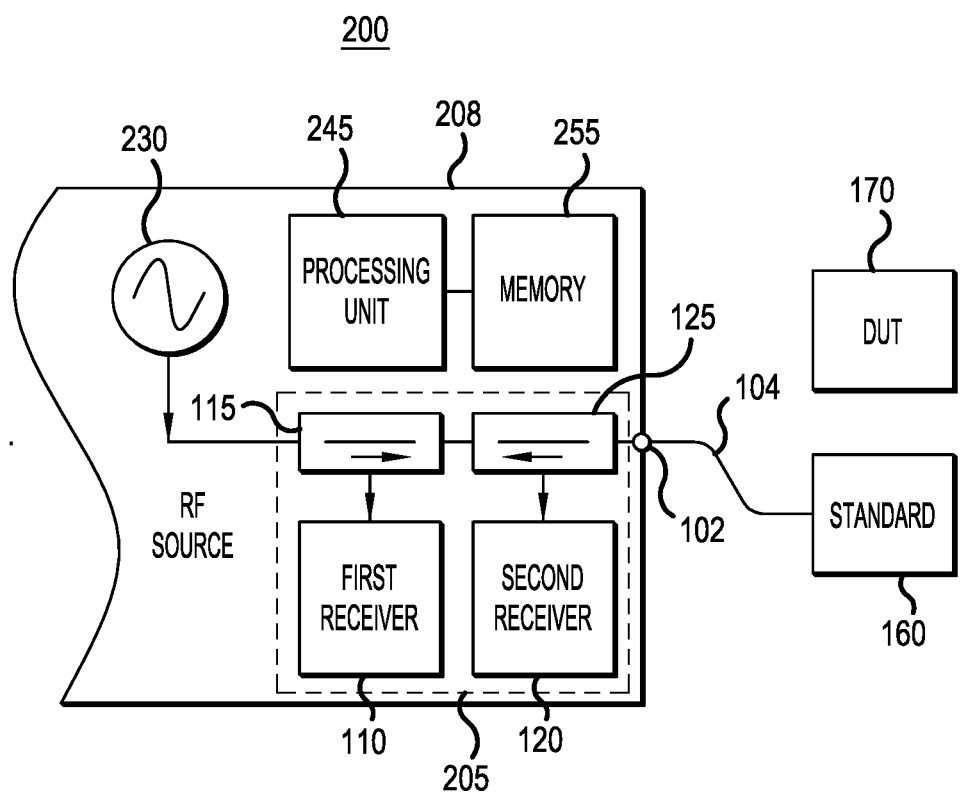
FIG. 2 is a simplified block diagram of a test system including a VNA circuit embedded in an RF signal generator, according to a representative embodiment.

FIG. 2 is a simplified block diagram of a test system including a VNA circuit embedded in an RF signal generator, according to a representative embodiment.

Referring to FIG. 2, test system 200 includes a test instrument 208 and a cable 104 (or other interconnect), where the test instrument 208 includes an embedded VNA circuit 205. The test instrument 208 is an RF signal generator, although only the components of the RF signal generator that are needed for performing VNA functionality are depicted for the sake of convenience. It is understood that additional components (indicated by ellipsis) may be required for the test instrument 208 to perform functions of an RF signal generator, as would be apparent to one skilled in the art.

As discussed above, the cable 104 is connectable to the calibration device 160 during a calibrating stage, and to the DUT 170 during a testing stage following the calibrating stage. The cable 104 may be manually connected to and disconnected from each of the calibration device 160 and the DUT 170 for calibration and testing, respectively, e.g., while remaining connected to the test instrument 208. For purposes of explanation, the cable 104 is shown connected to the calibration device 160 for calibrating the test system 200. The test instrument 208 includes a test port 102 for connecting to the calibration device 160 in the calibrating stage and to the DUT 170 in the testing stage via the cable 104. No RF port is needed, since the embedded VNA circuit 205 is embedded in the test instrument 208.

In the depicted embodiment, the embedded VNA circuit 205, indicated by a dashed block, includes first receiver 110 and second receiver 120, as well as first coupling device 115 and second coupling device 125, which may be individual couplers, for example, or may be implemented together as a dual directional coupler. The embedded VNA circuit 205 does not include an internal RF source because the test instrument 208, being an RF signal generator, already includes an RF source 230 for generating RF signals. The embedded VNA circuit 205 also may not include a separate processing unit or memory, which are also already present in an RF source as the processing unit 245 and the memory 255. However, in an embodiment, the processing unit 245 may be implemented using multiple computer processors, one or more of which may be dedicated to control of the embedded VNA circuit 205, without departing from the scope of the present teachings.

The first receiver 110 is configured to receive a (coupled) portion of an incident RF signal through the first coupling device 115, and the second receiver 120 is configured to receive a (coupled) portion of a reflected RF signal through the second coupling device 125. In the depicted embodiment, the incident RF signal is provided by the RF source 230 of the test instrument 208 and is output through the test port 102, and the reflected RF signal is reflected through the cable 104 to the test port 102 in response to reflection of the incident RF signal by the cable 104 and one of the calibration device 160 or the DUT 170. The RF source 230 provides the incident RF signal during calibration (e.g., determining effects of the cable 104 or other interconnect), as well as the incident RF signal during testing of the DUT 170.

The processing unit 245 and the memory 255 of the test instrument 208 are substantially the same as the processing unit 145 and the memory 155, discussed in detail with reference to FIG. 1, to implement and control the calibrating and testing stages. The processing unit 245 and/or the memory 255 and associated functionality may be provided, in whole or in part, by an external PC, as discussed above, without departing from the scope of the present teachings. The user changes connection of the cable 104 from the calibration device 160 to the DUT 170 after the calibrating stage and before the testing stage. The memory 250 may store a computer program and/or computer software executable by the processing unit 240. For example, in executing the computer program and/or software, the processing unit 240 may cause performance of the various steps in the method described below with reference to FIG. 5.

In order to perform proper testing of the DUT 170 by the test instrument 208, the test system 200 is first calibrated in the calibrating stage. For example, the cable 104 (or other interconnect) is characterized so that effects of error introduced by the cable 104 during testing of the DUT 170 by the test instrument 208 may be removed to assure accuracy. That is, the processing unit 245 may characterize the cable 104, e.g., using a user calibration file and a factory calibration file determined based on S-parameters of the calibration device 160 in response to incident RF signals at different frequencies, provided by the RF source 230. The processing unit 245 may also determine the S-parameters of the cable 104 that may be used to compensate for the error that will be introduced by the cable 104 during testing of the DUT 170.

The calibrating process includes connecting one end of the cable 104 (or other fixture) to the test port 102 of the test instrument 208, and the other end of the cable 104 to the calibration device 160. If the cable 104 is already connected to the DUT 170, it may be disconnected from the DUT 170 and reconnected to the calibration device 160 while remaining connected to the test port 102. For purposes of explanation, it may be assumed that the calibration device 160 is a manual calibration standard having open, short and load standards. Each of the standards is connected to the cable 104, in turn, and the processing unit 245 measures the connected standard, e.g., by causing the RF source 230 to step the frequency of an RF signal provided by the RF source 230 over a wide range of frequencies. The first and second receivers 110 and 120 measure the incident and reflected RF signals respectively received by the first and second receivers 110 and 120, in response to the stepped frequencies.

Similar to the discussion above, the memory 255 may contain a user calibration file and a factory calibration file. The factory calibration file includes S-parameter correction terms and absolute power correction terms of the first and second receivers 110 and 120, determined during factory calibration, for example. By using the S-parameter correction terms from the user calibration file and the factory calibration file, the effect of the cable 104 can be calculated, which provides S-parameters of the cable 104. The S-parameters of the cable 104 are used to compensate for errors caused by cable loss/phase errors, for example, which may compensate a source output signal to the DUT 170, or a measured signal from the DUT 170, in the testing stage. The S-parameter correction terms from the user calibration file may also be used to correct measurements of $S_{11}$ of the DUT 170 (measurement of the DUT match), for example, during the testing stage. The processing unit 245 may correct the measured signals, and ratio the corrected measured signals to calculate sets of S-parameters corresponding to the different frequencies, as well as magnitudes and phases.

That is, after the standards (e.g., open, short, load) are measured, the processing unit 245 will use the measurements to determine the S-parameter correction terms in the user calibration file, which are stored in the memory 255, corresponding to corrected measurements at the end of the cable 104. Also, the processing unit 245 will use the S-parameter correction terms in the user calibration file and factory calibration file to calculate the S-parameters of the cable 104. The user calibration file may then be used by the processing unit 245 during subsequent testing of the DUT 170 in the testing stage. To perform the testing, the cable 104 is reconnected to the DUT 170, and the test instrument 208 initiates testing which includes the RF source 230 generating another incident (test) RF signal provided to the DUT 170 via the cable 104. The processing unit 245 accesses the user calibration file to automatically correct for the error introduced by the cable 104 using the S-parameters of cable 104. For example, amplitude and phase of the RF signal(s) generated by the RF source 230 will be changed to correct for this error.

Figure 3:
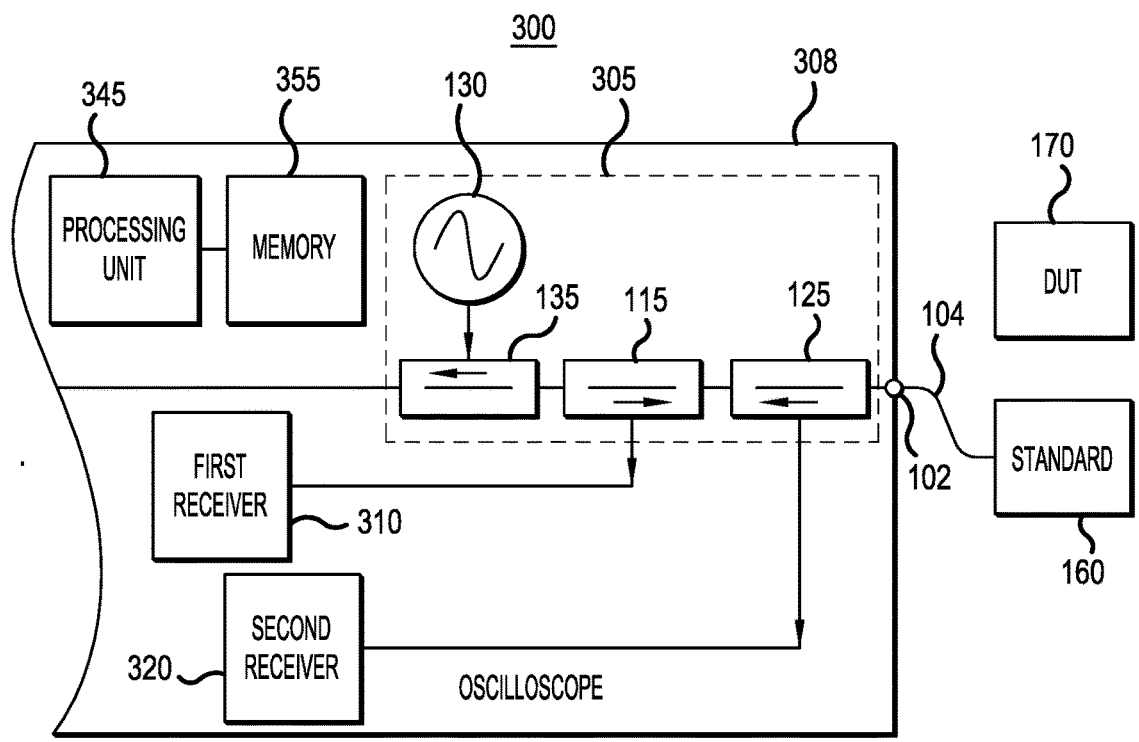
FIG. 3 is a simplified block diagram of a test system including a VNA circuit embedded in an oscilloscope, according to a representative embodiment.

FIG. 3 is a simplified block diagram of a test system including a VNA circuit embedded in an oscilloscope, according to a representative embodiment.

Referring to FIG. 3, test system 300 includes a test instrument 308 and a cable 104 (or other interconnect), where the test instrument 308 includes an embedded VNA circuit 305. The test instrument 308 is an oscilloscope, although only the components of the oscilloscope that are needed for performing VNA functionality are depicted for the sake of convenience. It is understood that additional components (indicated by ellipsis) may be required for the test instrument 308 to perform functions of an oscilloscope, as would be apparent to one skilled in the art.

As discussed above, the cable 104 is connectable to the calibration device 160 during a calibrating stage, and to the DUT 170 during a testing stage following the calibrating stage. The cable 104 may be manually connected to and disconnected from each of the calibration device 160 and the DUT 170 for calibration and testing, respectively, e.g., while remaining connected to the test instrument 308. For purposes of explanation, the cable 104 is shown connected to the calibration device 160 for calibrating the test system 300. The test instrument 308 includes test port 102 for connecting to the calibration device 160 in the calibrating stage and to the DUT 170 in the testing stage via the cable 104. No RF port is needed, since the embedded VNA circuit 305 is embedded in the test instrument 308.

In the depicted embodiment, the embedded VNA circuit 305, indicated by a dashed block, includes first coupling device 115, second coupling device 125, third coupling device 135 and internal RF source 130. The embedded VNA circuit 305 does not include first and second receivers because the test instrument 308, being an oscilloscope, already includes multiple receivers, indicated by illustrative first receiver 310 and second receiver 320. The embedded VNA circuit 305 also may not include a processing unit or memory, which are also already present in an oscilloscope as the processing unit 345 and the memory 355. However, in an embodiment, the processing unit 345 may be implemented using multiple computer processors, one or more of which may be dedicated to control of the embedded VNA circuit 305, without departing from the scope of the present teachings.

In the depicted embodiment, the first receiver 310 is configured to receive a (coupled) portion of an incident RF signal through the first coupling device 115, and the second receiver 320 is configured to receive a (coupled) portion of a reflected RF signal through the second coupling device 125, during the calibrating stage. The incident RF signal is provided by the internal RF source 130 of the embedded VNA circuit 305, since an oscilloscope typically does not include an RF source. The incident RF signal is output through the test port 102, and the reflected RF signal is reflected through the cable 104 to the test port 102 in response to reflection of the incident RF signal by the cable 104 one of the calibration device 160 or the DUT 170.

The processing unit 345 and the memory 355 of the test instrument 308 are substantially the same as the processing unit 145 and the memory 155, discussed in detail with reference to FIG. 1, to implement and control the calibrating and testing stages. The processing unit 345 and/or the memory 355 and associated functionality may be provided, in whole or in part, by an external PC, as discussed above, without departing from the scope of the present teachings. The user changes connection of the cable 104 from the calibration device 160 to the DUT 170 after the calibrating stage and before the testing stage. The memory 355 may store a computer program and/or computer software executable by the processing unit 345. For example, in executing the computer program and/or software, the processing unit 345 may cause performance of the various steps in the method described below with reference to FIG. 5.

In order to perform proper testing of the DUT 170 by the test instrument 308, the test system 300 is first calibrated in the calibrating stage. For example, the cable 104 (or other interconnect) is characterized so that effects of error introduced by the cable 104 during testing of the DUT 170 by the test instrument 308 may be removed to assure accuracy. That is, the processing unit 345 may determine the S-parameters of the cable 104, e.g., using a user calibration file and a factory calibration file determined based on S-parameter measurements of the calibration device 160 in response to incident RF signals at different frequencies, provided by the internal RF source 130. The processing unit 345 may also use the S-parameters of the cable 104 to compensate for error that will be introduced by the cable 104 during testing of the DUT 170.

The calibrating process includes connecting one end of the cable 104 (or other interconnect) to the test port 102 of the test instrument 308, and the other end of the cable 104 to the calibration device 160. If the cable 104 is already connected to the DUT 170, it may be disconnected from the DUT 170 and reconnected to the calibration device 160 while remaining connected to the test port 102. For purposes of explanation, it may be assumed that the calibration device 160 is a manual calibration standard having open, short and load standards. Each of the standards is connected to the cable 104, in turn, and the first and second receivers 310 and 320 measure the connected standard, where the processing unit 345 causes the internal RF source 130 to step the frequency of an RF signal provided by the internal RF source 130 over a wide range of frequencies. The first and second receivers 310 and 320 receive and measure the incident and reflected RF signals, respectively, in response to the stepped frequencies.

After the standards (e.g., open, short, load) are measured, the processing unit 345 will use the measurements to determine the S-parameter correction terms relative to the end of the cable 104, saved in the user calibration file, which is stored in the memory 355. Also, the processing unit 245 will use the S-parameter correction terms in the user calibration file and factory calibration file to calculate the S-parameters of the cable 104. The user calibration file may then be used by the processing unit 345 during subsequent testing of the DUT 170 in the testing stage. That is, to perform the testing, the cable 104 is reconnected to the DUT 170, and the test instrument 308 initiates testing, which includes receiving RF signals output by the DUT 170, e.g., either generated by the DUT 170 or responsive to stimulus signals (not shown) input to the DUT 170, via the cable 104. The processing unit 345 accesses the user calibration file to automatically correct for the error introduced by the cable 104 using the S-parameters of the cable. For example, the measured RF signals received from the DUT 170 will be modified to correct for this error.

Figure 4:
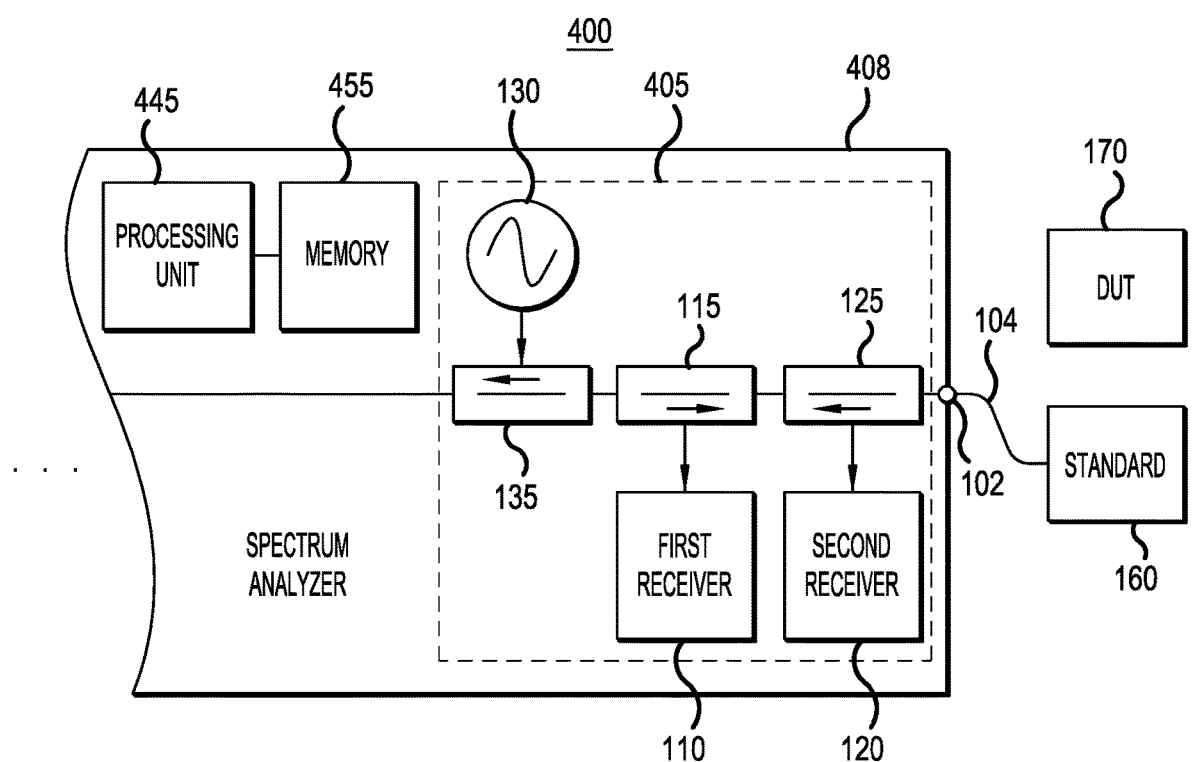
FIG. 4 is a simplified block diagram of a test system including a VNA circuit embedded in a spectrum analyzer, according to a representative embodiment.

FIG. 4 is a simplified block diagram of a test system including a VNA circuit embedded in an oscilloscope, according to a representative embodiment.

Referring to FIG. 4, test system 400 includes a test instrument 408 and a cable 104 (or other interconnect), where the test instrument 408 includes an embedded VNA circuit 405. The test instrument 408 is a spectrum analyzer, although only the components of the spectrum analyzer that are needed for performing VNA functionality are depicted for the sake of convenience. It is understood that additional components (indicated by ellipsis) may be required for the test instrument 408 to perform functions of a spectrum analyzer, as would be apparent to one skilled in the art.

As discussed above, the cable 104 is connectable to the calibration device 160 during a calibrating stage, and to the DUT 170 during a testing stage following the calibrating stage. The cable 104 may be manually connected to and disconnected from each of the calibration device 160 and the DUT 170 for calibration and testing, respectively, e.g., while remaining connected to the test instrument 408. For purposes of explanation, the cable 104 is shown connected to the calibration device 160 for calibrating the test system 400. The test instrument 408 includes test port 102 for connecting to the calibration device 160 in the calibrating stage and to the DUT 170 in the testing stage via the cable 104. No RF port is needed, since the embedded VNA circuit 405 is embedded in the test instrument 408.

In the depicted embodiment, the embedded VNA circuit 405, indicated by a dashed block, includes first receiver 110, second receiver 120 and internal RF source 130, as well as first coupling device 115, second coupling device 125 and third coupling device 135. The first receiver 110 is configured to receive a (coupled) portion of an incident RF signal through the first coupling device 115, and the second receiver 120 is configured to receive a (coupled) portion of a reflected RF signal through the second coupling device 125. In the depicted embodiment, the incident RF signal is provided by the internal RF source 130 via the third coupling device 135 and is output through the test port 102, and the reflected RF signal is reflected through the cable 104 to the test port 102 in response to reflection of the incident RF signal by the cable 104 and one of the calibration device 160 or the DUT 170. The embedded VNA circuit 405 may not include a processing unit or memory, which are already present in a spectrum analyzer as processing unit 445 and memory 455. However, in an embodiment, the processing unit 445 may be implemented using multiple computer processors, one or more of which may be dedicated to control of the embedded VNA circuit 405, without departing from the scope of the present teachings.

In the depicted embodiment, the first receiver 110 is configured to receive a (coupled) portion of an incident RF signal through the first coupling device 115, and the second receiver 120 is configured to receive a (coupled) portion of a reflected RF signal through the second coupling device 125, during the calibrating stage. The incident RF signal is provided by the internal RF source 130 of the embedded VNA circuit 405, since a spectrum analyzer typically does not include an RF source. The incident RF signal is output through the test port 102, and the reflected RF signal is reflected through the cable 104 to the test port 102 in response to reflection of the incident RF signal by the cable 104 and one of the calibration device 160 or the DUT 170.

The processing unit 445 and the memory 455 of the test instrument 408 are substantially the same as the processing unit 145 and the memory 155, discussed in detail with reference to FIG. 1, to implement and control the calibrating and testing stages. The processing unit 445 and/or the memory 455 and associated functionality may be provided, in whole or in part, by an external PC, as discussed above, without departing from the scope of the present teachings. The user changes connection of the cable 104 from the calibration device 160 to the DUT 170 after the calibrating stage and before the testing stage. The memory 4550 may store a computer program and/or computer software executable by the processing unit 445. For example, in executing the computer program and/or software, the processing unit 445 may cause performance of the various steps in the method described below with reference to FIG. 5.

In order to perform proper testing of the DUT 170 by the test instrument 408, the test system 400 is first calibrated in the calibrating stage. For example, the cable 104 (or other interconnect) is characterized so that effects of error introduced by the cable 104 during testing of the DUT 170 by the test instrument 408 may be removed to assure accuracy. That is, the processing unit 445 may characterize the cable 104, e.g., using a user calibration file and a factory calibration file determined and/or updated based on S-parameters of the calibration device 160 in response to incident RF signals at different frequencies, provided by the internal RF source 130. The processing unit 445 may also determine the S-parameters of the cable 104 that compensates for error that will be introduced by the cable 104 during testing of the DUT 170.

The calibrating process includes connecting one end of the cable 104 (or other interconnect) to the test port 102 of the test instrument 408, and the other end of the cable 104 to the calibration device 160. If the cable 104 is already connected to the DUT 170, it may be disconnected from the DUT 170 and reconnected to the calibration device 160 while remaining connected to the test port 102. For purposes of explanation, it may be assumed that the calibration device 160 is a manual calibration standard having open, short and load standards. Each of the standards is connected to the cable 104, in turn, and the first and second receivers 110 and 120 measure the connected standard, where the processing unit 445 causes the internal RF source 130 to step the frequency of an RF signal provided by the internal RF source 130 over a wide range of frequencies. The first and second receivers receive and measure the incident and reflected RF signals, respectively, in response to the stepped frequencies.

After the standards (e.g., open, short, load) are measured, the processing unit 445 will use the S-parameters to determine and/or update the user calibration file, which is stored in the memory 455, corresponding to the cable 104. The user calibration file may then be used by the processing unit 440 during subsequent testing of the DUT 170 in the testing stage. That is, to perform the testing, the cable 104 is reconnected to the DUT 170, and the test instrument 408 initiates testing, which includes receiving RF signals output by the DUT 170, e.g., either generated by the DUT 170 or responsive to stimulus signals (not shown) input to the DUT 170, via the cable 104. The processing unit 445 accesses the user calibration file to automatically correct for the error introduced by the cable 104, e.g., using S-parameters of the cable. For example, the measured RF signals received from the DUT 170 will be modified to correct for this error.

According to the various embodiments, the calibration and testing by various test instruments is simplified. For example, the user does not use a separate instrument, e.g., an independent and/or external VNA, to measure error in a portion (e.g., the cable or other interconnect) of the test system. Also, since the VNA functionality is already integrated in the test system, either as a previously connected VNA module or as an embedded VNA circuit, there is no need to disassemble the test system, e.g., separating the test instrument from the cable or other fixture, in order to measure and detect error in the separate components. That is, the calibration process is simplified because it is automated, and the cable does not need to be disconnected from and reconnected to the test system. Thus, measurements are generally more accurate and recalibration of the test system is easier. Also, the user does not need to manually transfer the measured data acquired by an independent and/or external VNA during the calibrating stage into the test instrument (e.g., RF signal generator, oscilloscope or spectrum analyzer) to enable error correction during the testing stage. Also, the embodiments provide for RF source corrections, such as power mismatch correction and phase alignment between multiple sources.

Figure 5:
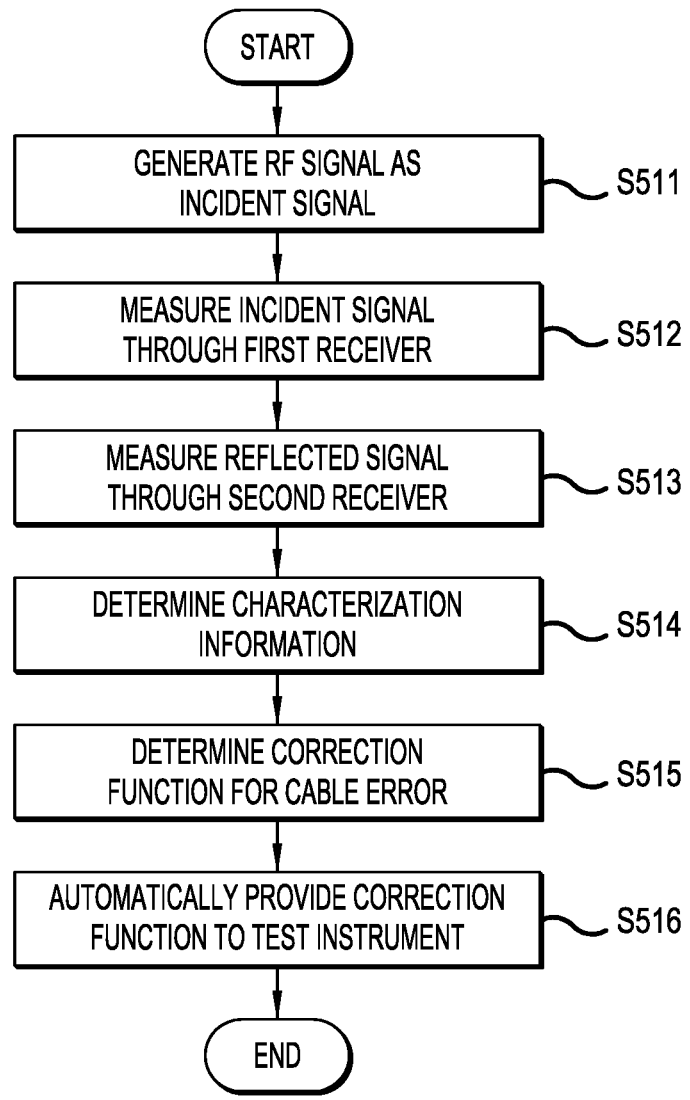
FIG. 5 is a simplified flow diagram showing a method of calibrating a test system using a universal VNA or an embedded VNA circuit, according to a representative embodiment.

FIG. 5 is a simplified flow diagram showing a method of calibrating a test system using a universal VNA module or an embedded VNA circuit, according to a representative embodiment. As mentioned above, the various steps of FIG. 5 may be implemented, for example, as a computer program and/or software, stored on a computer readable medium and executable by the processing unit 145, 245, 345 and 445, respectively, discussed above.

Referring to FIG. 5, a method is provided for calibrating a test system using a universal VNA module connected to a test instrument of the test system or an embedded VNA circuit embedded in the test instrument. The test system includes an interconnect (e.g., cable, probe, test fixture) connectable to a calibration device during a calibrating stage and connectable to a DUT during a testing stage.

In block S511, an RF signal is generated as an incident signal during the calibrating stage. The RF signal may be generated by an RF source in the VNA module or the embedded VNA circuit, or generated by an RF source in the test instrument (e.g., when the test instrument is an RF signal generator). The RF signal is generated by the RF source under control of the processing unit or by a processing unit dedicated to the VNA module or the embedded VNA circuit (e.g., VNA processing unit 140).

In block S512, the incident signal is measured by a first receiver, which receives the incident signal through a first coupling device. The incident signal is provided to the calibration device through a test port and the interconnect, which is connected to the test port, during the calibrating stage. In block S513, a reflected signal is measured by a second receiver, which receives the reflected signal through a second coupling device. The reflected signal is a portion of the incident signal reflected from the interconnect and the calibration device through the test port during the calibrating stage. The measurements by the first and second receivers are forward and reverse waves.

S-parameter correction terms are determined in block S514 using the incident signal measurements and the reflected signal measurements. That is, the forward and reverse waves are corrected and ratioed by the processing unit to calculate S-parameter correction terms relative to the end of the interconnect, which are independent of the standards used for calibration, for example. Other types of measurements may be made through the first and second receivers, without departing from the scope of the present teachings.

S-parameters of the interconnect are determined in block S515 using the S-parameter correction terms. The S-parameters of the interconnect represent errors introduced by the interconnect when passing RF signals. The S-parameter correction terms and the S-parameters of the interconnect may be (automatically) provided to the test instrument. In block S516, the S-parameter correction terms and the S-parameters of the interconnect are automatically applied by the processing unit in the test instrument, while testing the DUT to correct for error introduced by the interconnect during the testing stage. As discussed above, the interconnect may be connected to the test port during each of the calibrating stage and the testing stage, eliminating the steps of having to disconnect and reconnect the interconnect and/or a separate VNA to be performed by the user for conventional calibration and testing.

Various techniques for calibrating a test system are simplified according to the embodiments. For example, one technique is used to correct a test system, including a VNA module or an embedded VNA circuit, for the effects of an interconnect. First, the user connects a calibration device (e.g., calibration standards) to the test port of the VNA module or of the test instrument in which the VNA circuit is embedded. Next, the user connects the interconnect to the test port and connects calibration device to the other end of the cable. A processing unit uses 1-port measurement techniques to calculate the S-parameters of the cable. Once the S-parameters are calculated, the test instrument de-embeds the S-parameters from the measurement system, which corrects for source output power/phase and for measured power phase (e.g., when the test instrument is an oscilloscope or a spectrum analyzer).

Another technique is used to measure and display mismatch of the DUT. After calibration, the set of S-parameter correction terms allow the VNA module or embedded VNA circuit to accurately measure S-parameter $S_{11}$ at the end of the interconnect. Once the interconnect is connected to the DUT, the VNA module or embedded VNA circuit may be enabled according to the measured S-parameter correction terms to accurately measure the S-parameter $S_{11}$ as being equal to the DUT mismatch.

Another technique is used to calibrate magnitude and phase of the output of an RF source (e.g., when the test instrument is an RF signal generator). Calibrating magnitude and phase may be used to correct source errors over temperature and time, for example. First, the S-parameters and power of the universal VNA module or the embedded VNA circuit are calibrated using standard VNA techniques, e.g., using the calibration standards (e.g., calibration device 160) and power calibration using a power meter, as would be apparent to one skilled in the art. Then, the first and second receivers may be used to calibrate absolute output power of the RF source. For example, a test port of the test instrument is first connected to a load (e.g., 50-ohms load for a 50-ohm system, or to the DUT that is going to be measured). For example, during calibration the load is connected to the test port, and the output of the test instrument is calibrated for when the same load is connected to the test instrument. If a different load (e.g., a 40-ohm load) is connected to the test instrument, then the calibration may be affected due to source mismatch. So, the calibration should be performed using the same load with which DUT measurements will ultimately be made. Some users may connect a representative DUT during calibration for load measurements, hoping that subsequent DUTs will have about the same impedance match. Other users may connect a 50-ohm load during calibration because it is a 50-ohm system, and 50 ohms is a good average value.

Next the RF source is turned on, and the first and second receivers may be used to calculate output power accurately, which provides power calibration of the RF source. The VNA module or embedded VNA circuit may be used as a vector spectrum analyzer, for example, to measure a modulated signal from the RF source. Also, a multi-tone phase reference may be connected to the test port to perform multi-tone phase calibration, where the multi-tone phase reference generates a modulated signal with tones having known relative phase relationships to one another. The VNA module or embedded VNA circuit may likewise be used to measure cross-frequency phase characteristics of the modulated signal, i.e., measuring the phase reference. The first and second receivers then may be calibrated using the measured phase reference. The RF source generates a modulated signal (e.g., an RF test signal), which is measured by the calibrated first and second receivers, and the RF source is corrected with predistortion to remove errors in the measured modulated signal. That is, errors in the measured modulated signal may be used to digitally predistort the modulated RF source signal to remove modulation errors and cross-frequency phase characteristics, thereby calibrating the RF source output magnitude and phase flatness.

Figure 8A:
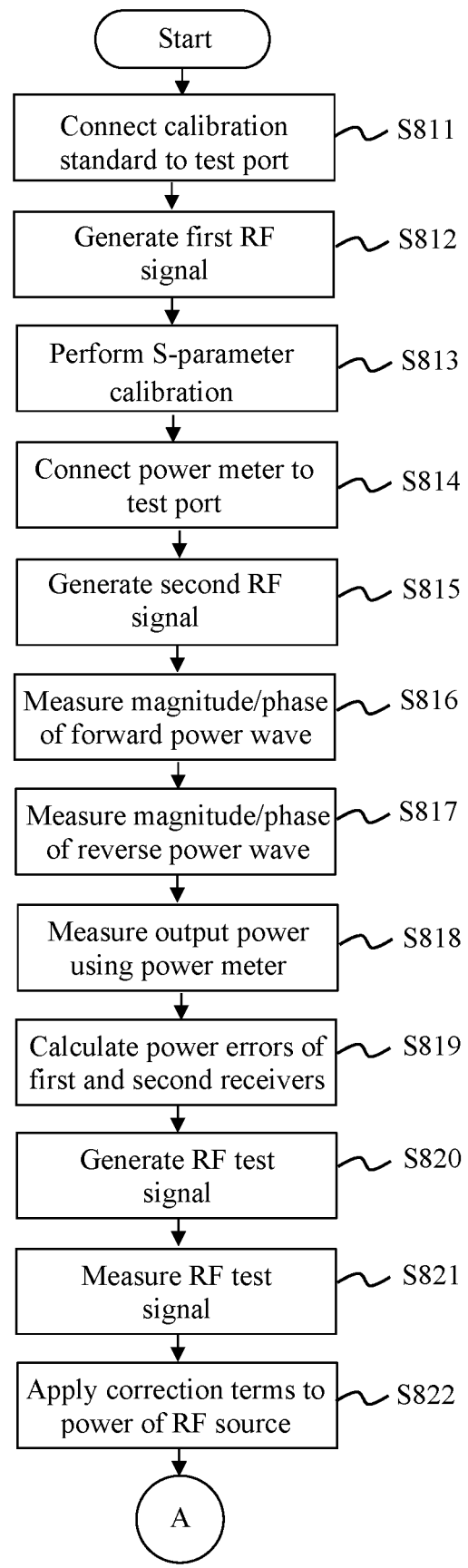
FIG. 8A is a simplified flow diagram showing a method of self-calibrating magnitude and phase of an RF source using a universal VNA or an embedded VNA circuit, according to a representative embodiment.

More particularly, FIG. 8A is a simplified flow diagram showing a method of self-calibrating magnitude and phase of an RF source using a universal VNA module or an embedded VNA circuit, according to a representative embodiment. The method may be implemented using any of the test systems discussed above with reference to FIGS. 1 to 4, for example, in which the RF source is a modulated RF source, in that it generates modulated RF signals, as opposed to continuous wave (CW) signals, for example. The test system (e.g., test system 100 including universal VNA module 105 or test system 200 including embedded VNA circuit 205) is connectable to each of a calibration standard and a power meter during a calibrating stage and to a DUT during a testing stage. In an embodiment, the test system is further connectable to a multi-tone phase reference during the calibrating stage, discussed below with reference to FIG. 8B. The various steps of the methods shown in FIGS. 8A and 8B may be implemented by and/or under control of a processing unit, such as the processing unit 145, for example.

Referring to FIG. 8A, a calibration device (e.g., calibration device 160) is connected to a test port (e.g., test port 102) of the test system in block S811. The calibration device may include multiple calibration standards, such as an open standard, a short standard, and a load standard. In block S812, a first RF signal is generated at an RF source (e.g., RF source in test instrument 108 or internal RF source 130) as a first incident signal. S-parameter calibration is performed in block S813 at the test port using the first RF signal in order to determine S-parameter correction terms for the test system. The first RF signal is provided consecutively to each of the standards of the calibration device through the test port. The first RF signal may be a CW signal, which may be swept over the desired frequencies to measure each of the calibration standards. For example, the first incident signal may be measured at the test port by a first receiver (e.g., first receiver 110), and a first reflected signal may be measured at the test port by a second receiver (e.g., second receiver 120) (for each of the calibration standards). The first reflected signal is a portion of the first incident signal reflected from the test port and the calibration standard through the test port. At this point, the universal VNA module or the embedded VNA circuit is able to measure S-parameters at the test port. The S-parameter correction terms are determined to provide S-parameter calibration at the test port using the measured first incident signal and the measured first reflected signal for each of the calibration standards of the calibration device.

Following the S-parameter calibration, power calibration is performed using the universal VNA module or the embedded VNA and a power meter (not shown). In block S814, the power meter is connected to the test system at the test port. In block S815, a second RF signal is generated by the RF source as a second incident signal, which is provided to the power meter through the test port. The second RF signal may also be a CW signal, and the RF source generating the second RF signal may be the same RF source or a different RF source than the one used for the S-parameter calibration, above. Also, the second RF signal may be the same signal as the first RF signal, without departing from the scope of the present teachings. The RF source may be swept over the desired frequencies to measure the power meter and the first and second receivers.

Magnitude and phase of a forward power wave of the second incident signal is measured in block S816 using the first receiver, and magnitude and phase of a reverse power wave of a second reflected signal is measured in block S817 using the second receiver, where the magnitude and phase measurements are corrected according to the S-parameter calibration, described above. The second reflected signal is a portion of the second incident signal reflected from the test port and the power meter. In block S818, output RF power of the CW signal is measured at the test port using the power meter, where the S-parameter correction terms enable measurement of the match of the power meter and correction for mismatch. At this point, the universal VNA module or the embedded VNA circuit is able to measure the forward and reverse power waves at the test port. Magnitude (power) errors of the first receiver and the second receiver are calculated in block S819, respectively, using the measured forward power wave, the measured reverse power wave, the S-parameter correction terms, as well as the output RF power measurements made by the power meter. In an embodiment, the magnitude of the forward power wave of the second incident signal may be normalized. The normalization may include scaling the magnitude of the forward power wave to match the magnitude of the output power measured by the power meter, and scaling the magnitude of the reverse power wave of the second incident signal so that a ratio of the forward power wave to the reverse power wave accurately represents S-parameter $S_{11}$. The output RF power measurements are also used to calibrate the power level of the RF source. Magnitude error correction terms of the forward and reverse power waves may be determined to remove the magnitude errors.

In block S820, an RF test signal is generated by an RF source. The RF test signal may also be a CW signal, and the RF source generating the RF test signal may be the same RF source or a different RF source as the one used for the S-parameter and/or power calibration. In an embodiment, the RF test signal may be a modulated (multi-tone) signal. The first and second receivers measure the RF test signal in block S821. The S-parameter correction terms and the magnitude error correction terms may be automatically applied in block S822 to measure and correct the power level of the RF source, which is used to generate the RF test signal. Correcting the power level corrects for error introduced by the universal VNA module or the embedded VNA circuit, and corrects for error introduced by mismatch at the test port, and corrects for errors introduced by the RF source.

Figure 8B:
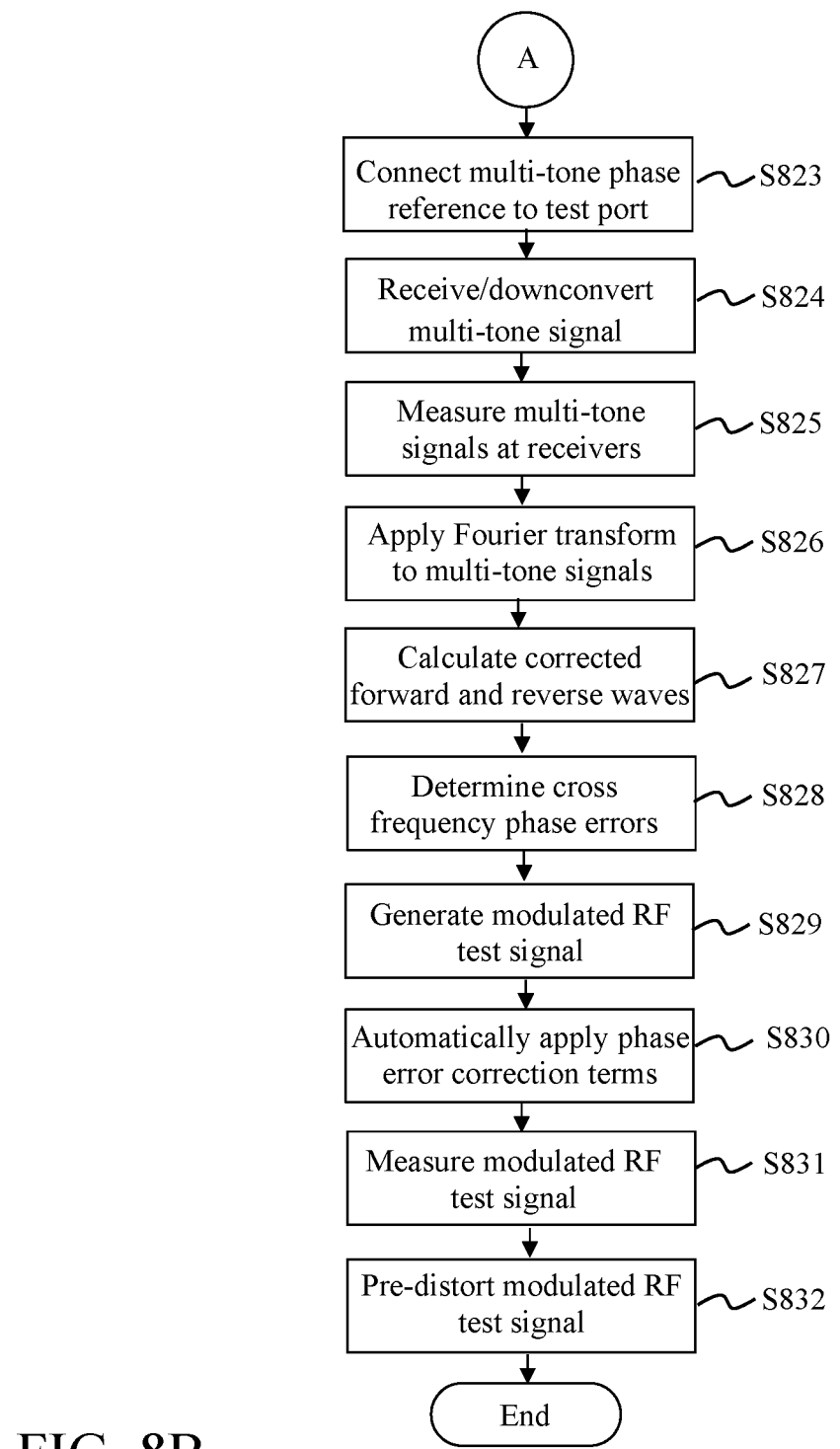
FIG. 8B is a simplified flow diagram showing a method of self-calibrating cross-frequency phase of an RF source using a universal VNA or an embedded VNA circuit, according to a representative embodiment.

FIG. 8B is a simplified flow diagram showing a method of self-calibrating cross-frequency phase of an RF source using a universal VNA module or an embedded VNA circuit, according to a representative embodiment. FIG. 8B begins where FIG. 8A ends, with calibration of the S-parameter and power already having been performed. The method may be implemented using any of the test systems discussed above with reference to FIGS. 1 to 4, for example. The test system (e.g., test system 100 including universal VNA module 105 or test system 200 including embedded VNA circuit 205) is connectable to a multi-tone phase reference (not shown) during the calibrating stage, in addition to the calibration standard and the power meter.

Referring FIG. 8B, the multi-tone phase reference is connected to the test instrument at the test port (e.g., test port 102) in block S823. The multi-tone phase reference is configured to generate a repetitive modulated (multi-tone) signal with tones having known relative phase relationships to one another. The modulated signal generated by the multi-tone phase reference is received and down-converted to an intermediate frequency (IF) at each of the first receiver and the second receiver in block S824. The down-converted modulated signals are measured at the first receiver and the second receiver in block S825, and a Fourier transform (e.g., FFT) is applied to the down-converted modulated signals at the first receiver and the second receiver in block S826 to calculate the frequency domain representations of the magnitudes and phases of the down-converted modulated signals. In block S827, the calculated magnitudes and phases (in the frequency domain) of the down-converted modulated signals and the S-parameter calibration are used to calculate corrected forward and reverse power waves of the modulated signals, and in block S828, the cross frequency phase errors of the corrected forward and reverse power waves of the modulated signals are determined at the test port. For example, the measured tones in the down-converted modulated signals may be compared to phase calibration data of a multi-tone phase reference and the cross frequency phase error correction terms may be determined based on the comparison.

In block S829, a modulated RF test signal is generated by the RF source. The RF source generating the modulated RF test signal may be the same RF source that generates the RF test signal in block S821, above. The cross frequency phase error correction terms may then be automatically applied in block S830, such that the first and second receivers are calibrated to measure S-parameters, RF power and cross-frequency phase of forward and reverse power waves of RF test signals generated by the RF source. Therefore, during the testing stage, for example, the RF source is turned on to generate a modulated RF signal, which is measured by the calibrated first and second receivers in block S831. That is, the calibration corrects for cross frequency phase errors introduced by the first receiver and the second receiver when receiving the modulated RF signal generated by the RF source. Also, in block S832, the modulation of the modulated RF signal is pre-distorted to correct for errors in the RF source.

The test system as calibrated may be used to measure mismatch of a DUT, and to level (flatten) the output of the RF source. For example, a DUT may be connected to the test port, and the universal VNA module or embedded VNA circuit may be used to measure the impedance match of the DUT. The calibrated RF source generates a modulated (multi-tone) RF test signal that is applied to the DUT through the universal VNA module or embedded VNA circuit, which measures the power and cross frequency phase of the modulated RF signal (forward wave). The S-parameters of the DUT may be used to correct for mismatch effects. Also, the modulation waveform of the RF source may be changed, according to the calibrations, to correct for the amplitude and phase errors of the modulated RF signal incident on the DUT. Thus, the VNA module or embedded VNA circuit accordingly may be used to level the RF source output and correct the output (magnitude and/or phase) for a current DUT mismatch. FIGS. 8A and 8B combined thus enable accurate measurement by the test instrument of the forward and reverse power waves at the test port and cross frequency phases of forward and reverse power waves.

Another technique is used to align phase between two RF sources. A known through is connected between the test port of a first VNA module/embedded VNA circuit corresponding to a first test system, and the test port of a second VNA module/embedded VNA circuit corresponding to a second test system. Alternatively, the test port of the first VNA module/embedded VNA circuit corresponding to the first test system may be connected to a test port of an RF source (not necessarily part of another VNA module/embedded VNA circuit) corresponding to a second test system. Each of the first and second VNA module/embedded circuit is thus able to align the relative output phases of the corresponding RF sources. Conventionally, in order to align two RF sources, a 2-port VNA would be calibrated and connected to the two RF sources. Signals from the two RF sources would be measured, and then the phases of the measured RF signals would be compared and adjusted to match. In contrast, the present embodiment is automated and self-contained in the VNA module/embedded VNA circuit. That is, a known through is connected between the two RF sources, where the through is "known" because it was measured using a VNA, for example. A second RF source provides a signal, while a first RF source is turned off so the VNA module/embedded VNA circuit of the first RF source may be used to measure the phase of the signal provided by the second RF source via the through. Since the through is known, the phase of the second RF source may be calculated at its test port by subtracting the phase of the through. Then, the second RF source is turned off and the first RF source is turned on to provide a signal. The VNA module/embedded VNA circuit of the first RF source is then used to measure the phase at its test port. The two measured phases are compared, and at least one of the two RF sources may be phase adjusted so that the two measured phases match.

Figure 9:
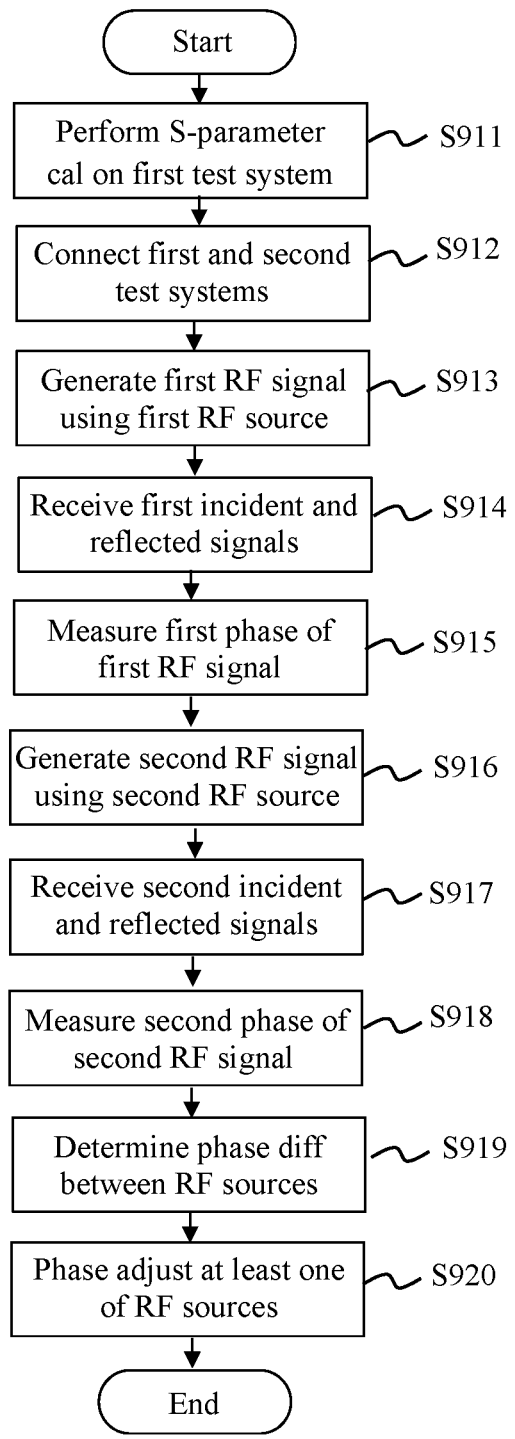
FIG. 9 is a simplified flow diagram showing a method of controlling phase differences between RF sources, according to a representative embodiment.

FIG. 9 is a simplified flow diagram showing a method of controlling phase differences between RF sources, according to a representative embodiment. At least one of the RF sources is included in a test system having a corresponding universal VNA or embedded VNA circuit, such as any of the test systems discussed above with reference to FIGS. 1 to 4, for example. The test system is connectable to another RF source, which may or may not be included in another test system having a corresponding universal VNA module or embedded VNA circuit. For purposes of discussion, below, it is assumed that the other RF source is not associated with a universal VNA module or an embedded VNA circuit. The various steps of the method shown in FIG. 9 may be implemented by and/or under control of a processing unit, such as the processing unit 145, for example.

Referring to FIG. 9, S-parameter calibration is performed in block S911 at a first test port of a first test system using calibration standards (e.g., calibration device 160), including an open, a short and a load, in order to determine S-parameter correction terms for the first test system. The first test system may be implemented as test system 100 including universal VNA module 105 in FIG. 1 or test system 200 including embedded VNA circuit 205 in FIG. 2, for example, and includes a first RF source, although other types of test systems including a VNA may be included without departing from the scope of the present teachings. As discussed above with reference to FIG. 8A, for example, the calibration standards may be connected one at a time to the first test port of the first test system. A calibration RF signal is generated at a first RF source of the first test system (e.g., RF source in test instrument 108 or internal RF source 130) as an incident signal, which is provided to each of the calibration standards, where the calibration RF signal may be swept over the desired frequencies to measure each of the calibration standards. The incident signal is measured at the first test port through the first receiver (e.g., first receiver 110) of the first test system, and a reflected signal is measured at the first test port through the second receiver (e.g., second receiver 120) of the first test system. The S-parameter correction terms may then be determined to provide S-parameter calibration of the first and second receivers at the first test port using the measured incident signal and the measured reflected signal.

In block S912, the first test port of the first test system is connected to a second test port of a second test system. The second test system includes a second RF source, but does not require other components of a VNA, although in an embodiment, the second test system may likewise be implemented as the test system 100 or the test system 200, for example, as discussed above with reference to the first test system.

In block S913, a first RF signal (or first incident signal) is generated using the first RF source of the first test system, while the second RF source of the second test system is turned off. In block S914, the first incident signal is received by the first receiver, and a first reflected signal is received by the second receiver, using the S-parameter correction terms applied to the first and second receivers. The S-parameter correction terms determined in block S911 are applied to correct the first and second receivers. The first phase of the first RF signal is then measured at the first test port using the received first incident signal and the received first reflected signal in block S915. The phase of the first receiver equals the (corrected) first phase of the first RF source.

In block S916, a second RF signal (or second incident signal) is generated using the second RF source of the second test system, while the first RF source of the first test system is turned off. In block S917, the second incident signal is received through the second receiver in the first test system, and a second reflected signal is received through the first receiver of the first test system, using the S-parameter correction terms. The S-parameter correction terms determined in block S911 are applied to correct the first and second receivers. The second phase of the second RF signal is then measured at the first test port using the received second incident signal and the received second reflected signal in block S918. The phase of the second receiver equals the (corrected) second phase of the first RF source.

A phase difference between the first phase of the first RF signal from the first RF source and the second phase of the second RF signal from the second RF source is determined in block S919. For example, the phase difference may be determined by subtracting the second phase from the first phase. In block S920, at least one of the first RF source and the second RF source is adjusted by a phase adjustment amount to remove the determined phase difference between the first and second RF sources, thereby phase aligning the first and second RF sources for subsequent DUT testing.

In an embodiment, a through (e.g., cable) may be connected between the first test port of the first test system and the second test port of the second test system. Parameters of the through are known, such as the phase of the through. Therefore, measuring the second phase of the second RF signal, generated by the second RF source while the first RF source is off, includes subtracting the known phase of the through. That is, because the first test system measures the first phase of the first RF signal, there is no need to correct the first RF signal for the phase associated with the through. However, because the first test system also measures the second phase of the second RF signal at the first test port, the phase of the through must be subtracted to calculate the second phase of the second RF signal at the second test port. Accordingly, the first phase and the second phase are known at each of the first test port and the second test port.

Figure 10:
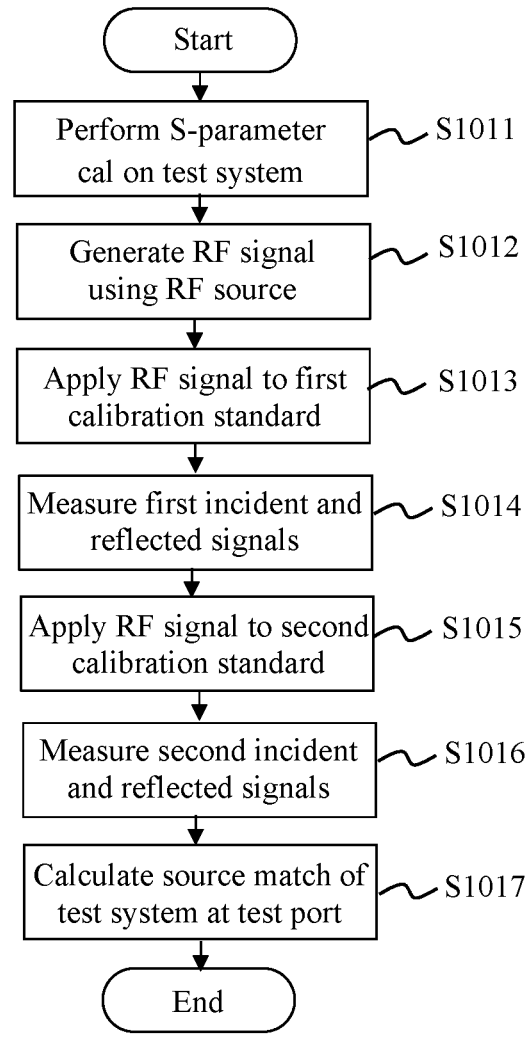
FIG. 10 is a simplified flow diagram showing a method of source match measurement of an RF source, according to a representative embodiment.

FIG. 10 is a simplified flow diagram showing a method of performing source match measurement of an RF source, according to a representative embodiment. The RF source may be included in a test system having a corresponding universal VNA module or embedded VNA circuit, such as any of the test systems discussed above with reference to FIGS. 1 to 4, for example. The various steps of the method shown in FIG. 10 may be implemented by and/or under control of a processing unit, such as the processing unit 145, for example.

Referring to FIG. 10, S-parameter calibration is performed in block S1011 at a test port of a test system using calibration standards (e.g., calibration device 160), including an open, a short and a load, in order to determine S-parameter correction terms for the test system. The test system may be implemented as test system 100 including universal VNA module 105 in FIG. 1 or test system 200 including embedded VNA circuit 205 in FIG. 2, for example, and includes an RF source, although other types of test systems including a VNA may be included without departing from the scope of the present teachings. As discussed above with reference to FIG. 8A, for example, the calibration standards may be connected one at a time to the test port of the test system. A calibration RF signal is generated at an RF source of the test system (e.g., RF source in test instrument 108 or internal RF source 130) as an incident signal, which is provided to each of the calibration standards, where the calibration RF signal may be swept over the desired frequencies to measure each of the calibration standards. The incident signal is measured at the test port through a first receiver (e.g., first receiver 110) of the test system, and a reflected signal is measured at the test port through a second receiver (e.g., second receiver 120) of the first test system. The S-parameter correction terms may then be determined to provide S-parameter calibration of the first and second receivers at the test port using the measured incident signal and the measured reflected signal.

In block S1012, the RF source is configured to generate an RF signal, which may be a CW signal or a modulated signal. The RF signal is applied to a first calibration standard in block S1013. In block S1014, a corresponding first incident signal is measured at the test port by the calibrated first receiver, and a first reflected signal is measured at the test port by the calibrated second receiver. The RF signal is then applied to a second calibration standard, which is different from the first calibration standard, in block S1015. For purposes of illustration, the first calibration standard is a short and the second calibration standard is an open, although other combinations of calibration standards may be incorporated without departing from the scope of the present teachings. In block S1016, a corresponding second incident signal is measured at the test port by the calibrated first receiver, and a second reflected signal is measured at the test port by the calibrated second receiver. The source match of the test system is determined at the test port in block S1017 using the measured first incident and reflected signals and the measured second incident and reflected signals.

Figure 11:
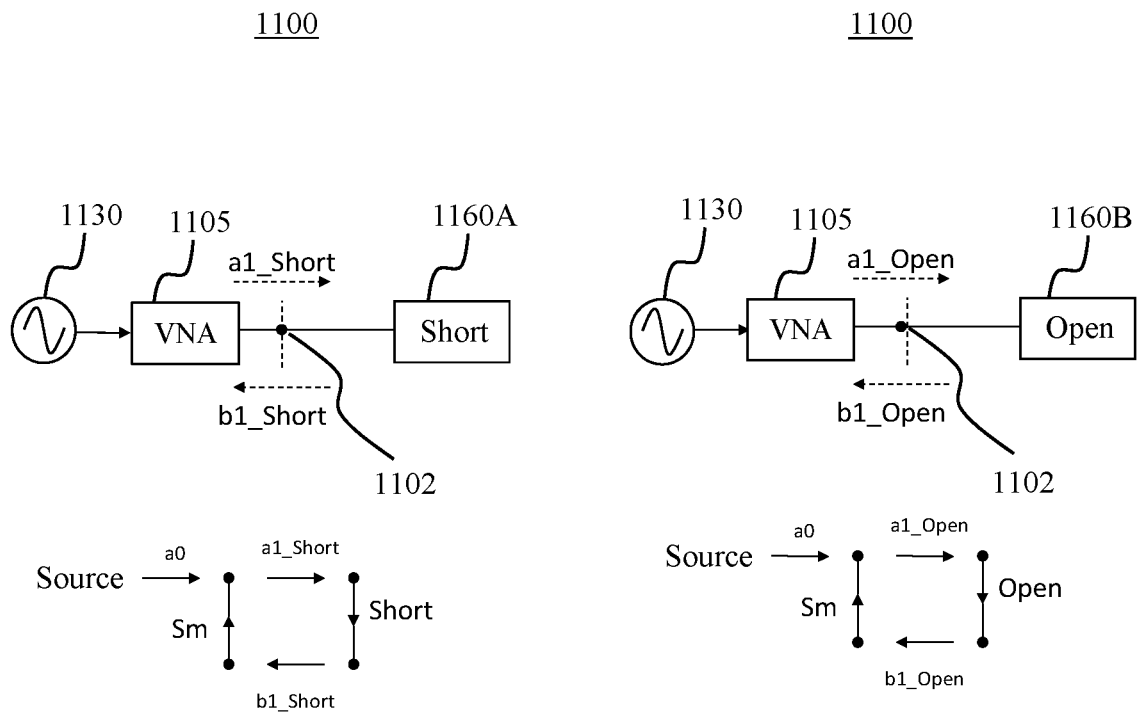
FIG. 11 is a simplified block diagram of a test system showing source match measurement, according to a representative embodiment.

FIG. 11 is a simplified block diagram of a test system showing source match measurement, according to a representative embodiment.

Referring to FIG. 11, test system 1100 includes an RF source 1130, a VNA 1105 and a test port 1102, which is connectable to calibration standards, indicated by first (short) calibration standard 1160A and second (open) calibration standard 1160B. The VNA 1105 may be implemented using any type VNA discussed herein, such as a universal VNA module (e.g., universal VNA module 105) or an embedded VNA circuit (e.g., embedded VNA circuit 205). Likewise, the RF source 1130 may be implemented using any type of RF source discussed herein (e.g., RF sources 130 or 230).

The test system 1100 has an unknown source match (Sm) that is independent of the load. The RF signal (a0) is generated by the RF source 1130, where the RF signal (a0) is also independent of the load. With the first calibration standard 1160A connected to the test port 1102, the first incident signal (a1_Short) corresponding to the RF signal (a0) is output from the test port 1102, and the first reflected signal (b1_Short) reflected from the first calibration standard 1160A is input to the test port 1102. Likewise, with the second calibration standard 1160B connected, the second incident signal (a1_Open) corresponding to the RF signal (a0) is output from the test port 1102, and the second reflected signal (b1_Open) reflected from the second calibration standard 1160B is input to the test port 1102. The relationships between the source match (Sm) and the first and second calibration standards 1160A and 1160B are provided by power wave Equations (1) and (2):

$$a0 + b1\_Short * Sm = a1\_Short \quad (1)$$

$$a0 + b1\_Open * Sm = a1\_Open \quad (2)$$

Subtracting Equation (2) from Equation (1) provides Equation (3) to solve for the source match (Sm):

$$Sm = (a1\_Short - a1\_Open)/(b1\_Short - b1\_Open) \quad (3)$$

In other words, the source match (Sm) is the ratio of the difference between the first and second incident signals and the difference between the first and second reflected signals. The various steps of the method shown in FIG. 10 and the calculations shown in FIG. 11 may be implemented by and/or under control of a processing unit, such as the processing unit 145, for example. Once the source match (Sm) of the test system 1100 has been determined, it may be implemented for future testing. For example, the source match (Sm) affects the accuracy of the power level being applied to a DUT by the RF source 1130. Uncertainty with regard to the power level may be calculated using the source match (Sm) of the test system and DUT match values. Also, the source match (Sm) may vary versus frequency and power level of the RF signal output by the RF source 1130. So, a specific determination of the source match (Sm) according to the depicted embodiment enables determination of an exact value for the setting, as opposed to assuming a worse-case value that takes into account all possible settings.

Figure 6:
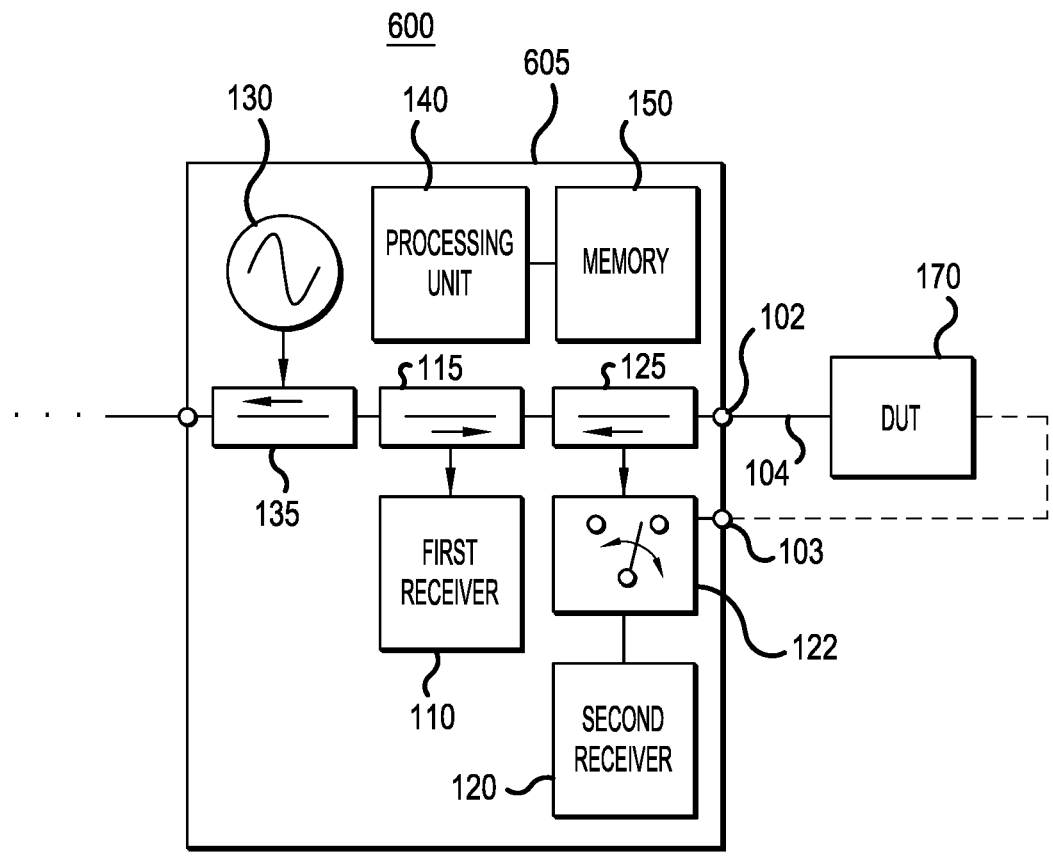
FIG. 6 is a simplified block diagram of a test system including a universal VNA module with a transfer switch connected to one receiver, according to a representative embodiment.
Figure 7:
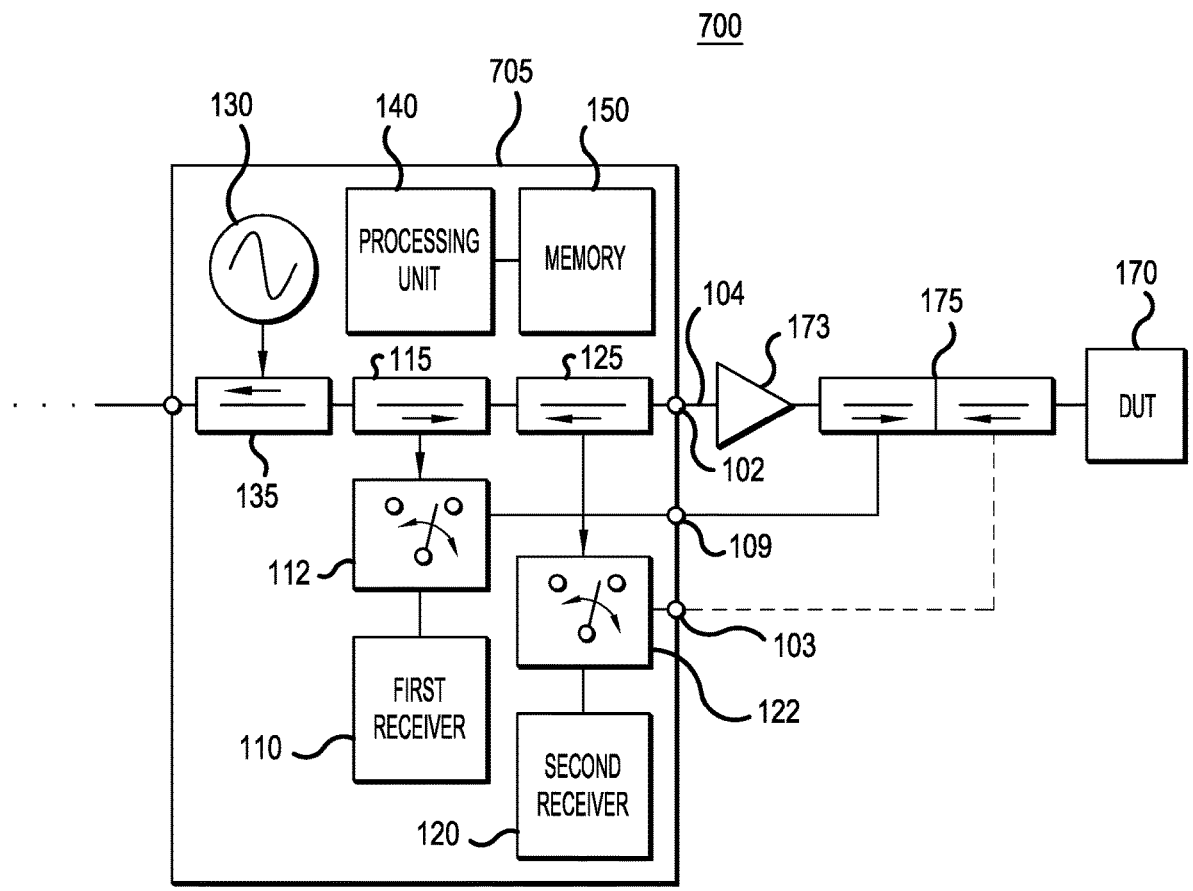
FIG. 7 is a simplified block diagram of a test system including a universal VNA module with transfer switches connected to two receivers, according to a representative embodiment.

As mentioned above, one or more transfer switches may be included in the test system. For example, the first and second receivers may include transfer switches to provide external access for more complicated measurements. FIGS. 6 and 7 are block diagrams depicting the test system as shown in FIG. 1 including transfer switches. More particularly, FIG. 6 is a simplified block diagram of a test system including a universal VNA module with a transfer switch connected to one receiver, according to a representative embodiment, and FIG. 7 is a simplified block diagram of a test system including a universal VNA module with transfer switches connected to both receivers, according to a representative embodiment. The single transfer switch shown in FIG. 6 may be used for to measuring DUT gain, and the multiple transfer switches shown n FIG. 7 may be used to correct for external electrical components, such as preamplifiers, for example. The transfer switch configurations shown in FIGS. 6 and 7 may likewise be included in embedded VNA circuits and/or test instruments, such as embedded VNA circuits 205, 305 and 405 discussed below, without departing from the scope of the present teachings.

Referring to FIG. 6, test system 600 includes a VNA module 605 connected between a test instrument, such as RF test instrument 108 (not shown in FIG. 6) via RF port 101 and a DUT 170 via test port 102. The VNA module 605 is the same as the VNA module 105 discussed above with reference to FIG. 1, with the addition of a transfer switch 122 connected between the second receiver 120 and the second coupling device 125, to selectively route the second receiver 120 to the front panel.

The transfer switch 122 has a first position for connecting the second receiver 120 to the second coupling device 125 to receive a portion of the reflected RF signal through the second coupling device 125 during the calibrating stage. During the calibrating stage, a calibration device (not shown in FIG. 6), such as the calibration device 160, is connected to the VNA module 605 via the test port 102 to enable determination of S-parameter correction terms, as described above. Notably, calibration would further include connecting a known interconnect between test port 102 and input test port 103 to provide a transmission calibration, so that subsequent gain measurements are accurate. The transfer switch 122 has a second positon for connecting the second receiver 120 to the input test port 103 to receive a response signal output by the DUT 170, indicated by a dashed line, in response to a stimulus signal during the testing stage. The stimulus signal may be generated by an RF signal generator connected to the RF port 101 and provided to the DUT 170 through the test port 102, for example, during the testing stage.

Referring to FIG. 7, test system 700 includes a VNA module 705 connected between a test instrument (not shown in FIG. 7) via RF port 101 and a DUT 170 via test port 102. The test system 700 further includes an electrical component 173 (e.g., a pre-amplifier) and a dual directional coupler 175 connected in series between the test port 102 and the DUT 170 during the testing stage. The VNA module 705 is the same as the VNA module 105 discussed above with reference to FIG. 1, with the addition of a first transfer switch 112 connected between the first receiver 110 and the first coupling device 115, and a second transfer switch 122 connected between the second receiver 120 and the second coupling device 125, where the first and second transfer switches 112 and 122 selectively route the first receiver 110 and/or the second receiver 120 to the front panel, respectively.

The first transfer switch 112 has a first position for connecting the first receiver 110 to the first coupling device 115 to receive a portion of the incident RF signal through the first coupling device 115 during the calibrating stage. The first transfer switch 112 has a second positon for connecting the first receiver 110 to an input test port 109 to receive an output signal output from the electrical component 173, indicated by a solid line, in response to a stimulus signal during the testing stage. The second transfer switch 122 has a first position for connecting the second receiver 120 to the second coupling device 125 to receive a portion of the reflected RF signal through the second coupling device 125 during the calibrating stage. The transfer switch 122 has a second positon for connecting the second receiver 120 to an input test port 103 to receive a reflected signal from the DUT 170, indicated by a dashed line, in response to the output signal from the electrical component 173 during the testing stage.

During the calibrating stage, a calibration device (not shown in FIG. 7), such as the calibration device 160, is connected to the VNA module 705 via the test port 102 to enable determination of S-parameter correction terms, as described above. During the testing stage, the stimulus signal may be generated by an RF signal generator connected to the RF port 101 and provided to the DUT 170 through the test port 102, for example. Errors from the electrical component 173 and the dual directional coupler 175 are corrected in substantially the same manner as the magnitude and phase of an RF source, as discussed above. The electrical component 173 and the dual directional coupler 175 may be connected to the test port 102 during calibration and remain connected when subsequently measuring the DUT 170. In the depicted embodiment, when the electrical component 173 is a pre-amplifier, for example, the test instrument (e.g., test instrument 108) is an RF source, since an oscilloscope and a spectrum analyzer would not be able to measure backwards through the pre-amplifier.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed:

1. A method of determining a source match of a test system, comprising a radio frequency (RF) source, a vector network analyzer (VNA) and a test port, the method comprising:

connecting a first calibration standard to the test port;

generating an RF signal using the RF source, and applying the RF signal to the first calibration standard;

measuring a first incident signal of the RF signal at a first receiver of the test system, and measuring a first reflected signal at a second receiver of the test system;

connecting a second calibration standard to the test port;

measuring a second incident signal of the RF signal at the first receiver of the test system, and measuring a second reflected signal at the second receiver of the test system; and determining the source match of the test system using the first incident signal, the first reflected signal, the second incident signal and the second reflected signal, wherein is determining the source match comprises determining a ratio of (i) a difference between the first incident signal and the second incident signal and (ii) a difference between the first reflected signal and the second reflected signal.

2. The method of claim 1, wherein the first calibration standard is a short and the second calibration standard is an open.

3. The method of claim 2, wherein the source match (Sm) is determined as:

$$Sm=(a1\_Short-a1\_Open)/(b1\_Short-b1\_Open),$$

wherein a1_Short is the first incident signal, a1_Open is the second incident signal, b1_Short is the first reflected signal, and b1_Open is the second reflected signal.

4. The method of claim 1, further comprising:

initially connecting calibration standards to the test port; and generating another RF signal at the RF source as another incident signal applied to the calibration standards, and determining S-parameter correction terms to provide S-parameter calibration at the test port using the another incident signal and another reflected signal based on the another incident signal, wherein determining the source match further uses the S-parameter correction terms.

5. The method of claim 1, wherein the source match varies versus frequency and power level of the RF signal generated using the RF source.

6. A test instrument, including an embedded vector network analyzer (VNA) circuit, for testing a device under test (DUT), the test instrument comprising:

a radio frequency (RF) source configured to generate an RF signal during a calibrating stage;

a test port configured to connect to each of a first calibration standard and a second calibration standard for determining a source match of the RF source;

a first receiver configured to measure a first incident signal of the RF signal through a first coupling device with the test port connected to the first calibration standard, and to measure a second incident signal of the RF signal through the first coupling device with the test port connected to the second calibration standard;

a second receiver configured to measure a first reflected signal responsive to the first incident signal of the RF signal through a second coupling device with the test port connected to the first calibration standard, and to measure a second reflected signal responsive to the second incident signal of the RF signal through the second coupling device with the test port connected to the second calibration standard; and a processing unit programmed to determine the source match of the RF source based on the first incident signal and first reflected signal, and the second incident signal and the second reflected signal, wherein the processing unit is programmed to determine the source match by determining a ratio of (i) a difference between the first incident signal and the second incident signal and (ii) a difference between the first reflected signal and the second reflected signal.

7. The test instrument of claim 6, wherein the first calibration standard is a short and the second calibration standard is an open.

8. The test instrument of claim 7, wherein the processing unit is programmed to determine the source match (Sm) of the RF source as:

$$Sm=(a1\_Short-a1\_Open)/(b1\_Short-b1\_Open),$$

wherein a1_Short is the first incident signal, a1_Open is the second incident signal, b1_Short is the first reflected signal, and b1_Open is the second reflected signal.

9. The test instrument of claim 6, wherein:

the test port is further configured to initially connect to each of a plurality of different calibration standards, the RF source is further configured to initially generate a calibration RF signal as a calibration incident signal applied to each of the plurality of different calibration standards, and the processing unit is further configured to determine S-parameter correction terms for providing S-parameter calibration at the test port based on the calibration incident signal and a calibration reflected signal responsive to the calibration incident signal, and to determine the source match further based on the S-parameter correction terms.

10. The test instrument of claim 6, wherein the source match varies versus frequency and power level of the RF signal generated by the RF source.

11. The test instrument of claim 6, wherein the test instrument is an RF signal generator comprising the RF source, and wherein the embedded VNA circuit comprises the first and second receivers, and the first and second coupling devices, and excludes the RF source.

12. The test instrument of claim 6, wherein the test instrument is a spectrum analyzer, and wherein the embedded VNA circuit comprises the first and second receivers, the first and second coupling devices, the RF source, and a third coupler for coupling the incident RF signal from the RF source.

13. The test instrument of claim 6, wherein the test instrument is an oscilloscope comprising the first and second receivers, and wherein the embedded VNA circuit comprises the first and second coupling devices, the RF source, and a third coupling device for coupling the incident RF signal from the RF source, and excludes the first and second receivers.

14. The test instrument of claim 6, wherein each of the first and second coupling devices comprises one of a coupler, a coupled line structure, a combiner, a diplexer, a splitter, a balun, a bridge, or a resistive divider.

15. A vector network analyzer (VNA) module connectable to different types of test instruments, the VNA module comprising:

a radio frequency (RF) source configured to generate an RF signal during a calibrating stage;

an RF port configured to connect to a test instrument;

a test port configured to connect to each of a first calibration standard and a second calibration standard for determining a source match of the RF source;

a first receiver configured to measure a first incident signal of the RF signal through a first coupling device with the test port connected to the first calibration standard, and to measure a second incident signal of the RF signal through the first coupling device with the test port connected to the second calibration standard;

a second receiver configured to measure a first reflected signal responsive to the first incident signal of the RF signal through a second coupling device with the test port connected to the first calibration standard, and to measure a second reflected signal responsive to the second incident signal of the RF signal through the second coupling device with the test port connected to the second calibration standard; and a processing unit programmed to determine the source match of the RF source based on the first incident signal and first reflected signal, and the second incident signal and the second reflected signal, wherein the processing unit is programmed to determine the source match by determining a ratio of (i) a difference between the first incident signal and the second incident signal and (ii) a difference between the first reflected signal and the second reflected signal.

16. The VNA module of claim 15, wherein:

the test port is further configured to initially connect to each of a plurality of different calibration standards, the RF source is further configured to initially generate a calibration RF signal as a calibration incident signal applied to each of the plurality of different calibration standards, and the processing unit is further configured to determine S-parameter correction terms for providing S-parameter calibration at the test port based on the calibration incident signal and a calibration reflected signal responsive to the calibration incident signal, and to determine the source match further based on the S-parameter correction terms.

17. The VNA module of claim 15, wherein the RF signal is coupled to the first receiver through a third coupling device.

18. The VNA module of claim 15, wherein the first calibration standard is a short and the second calibration standard is an open.

19. The VNA module of claim 18, wherein the processing unit is programmed to determine the source match (Sm) of the RF source as:

$$Sm = (a1\_Short - a1\_Open)/(b1\_Short - b1\_Open),$$

wherein a1_Short is the first incident signal, a1_Open is the second incident signal, b1_Short is the first reflected signal, and b1_Open is the second reflected signal.

20. The VNA module of claim 15, wherein each of the first and second coupling devices comprises one of a coupler, a coupled line structure, a combiner, a diplexer, a splitter, a balun, a bridge, or a resistive divider.

* * * * *